(12) United States Patent
Høyerby

(10) Patent No.: US 9,515,617 B2
(45) Date of Patent: Dec. 6, 2016

(54) AUDIO AMPLIFIER USING MULTI-LEVEL PULSE WIDTH MODULATION

(75) Inventor: Mikkel Høyerby, Copenhagen (DK)

(73) Assignee: Merus Audio ApS, Herlev (DK)

( * ) Notice: Subject to any disclaimer, the term of this patent is extended or adjusted under 35 U.S.C. 154(b) by 642 days.

(21) Appl. No.: 13/881,509

(22) PCT Filed: Oct. 27, 2011

(86) PCT No.: PCT/EP2011/068873

§ 371 (c)(1),
(2), (4) Date: May 17, 2013

(87) PCT Pub. No.: WO2012/055968

PCT Pub. Date: May 3, 2012

(65) Prior Publication Data

US 2013/0223651 A1     Aug. 29, 2013

Related U.S. Application Data

(60) Provisional application No. 61/407,262, filed on Oct. 27, 2010.

(51) Int. Cl.
| | | |
|---|---|---|
| H03F 99/00 | (2009.01) | |
| H03F 3/00 | (2006.01) | |
| H03F 3/217 | (2006.01) | |
| H02M 7/487 | (2007.01) | |

(52) U.S. Cl.
CPC ............. H03F 3/00 (2013.01); H03F 3/2173 (2013.01); H03F 3/2178 (2013.01); H02M 7/487 (2013.01)

(58) Field of Classification Search
CPC ........ H03F 3/00; H03F 3/2173; H03F 3/2178; H03F 3/217; H02M 7/487; H02M 3/07; H03K 17/56; H03M 7/48; H01M 8/18; H02J 7/00; G05F 1/10

USPC .......... 381/28, 57, 120; 700/94; 330/207 A, 330/207 R, 96, 131, 251, 297, 255, 253; 327/423, 110, 108, 109, 111, 112, 424, 327/536, 588

See application file for complete search history.

(56) References Cited

U.S. PATENT DOCUMENTS

| | | |
|---|---|---|
| 4,894,621 A | 1/1990 | Koenig et al. |
| 6,373,336 B1 | 4/2002 | Anderskouv et al. |
| 6,492,868 B2 | 12/2002 | Kirn |
| 7,675,361 B2 | 3/2010 | Guo et al. |
| 2002/0041246 A1 | 4/2002 | Chang et al. |

(Continued)

FOREIGN PATENT DOCUMENTS

| | | |
|---|---|---|
| CN | 101662262 B | 10/2012 |
| EP | 0932932 B1 | 4/1999 |

(Continued)

OTHER PUBLICATIONS

International Search Report corresponding to co-pending International Patent Application Serial No. PCT/EP2011/068873, European Patent Office, dated Mar. 14, 2012; (7 pages).

(Continued)

*Primary Examiner* — Leshui Zhang
(74) *Attorney, Agent, or Firm* — Nixon Peabody LLP

(57) ABSTRACT

The present invention relates in one aspect to a class D audio amplifier with improved output driver topology supporting multi-level output signals such as 3-level, 4-level or 5-level pulse width or pulse density modulated output signals for application to a loudspeaker load. The present class D audio amplifiers are particularly well-suited for high-volume consumer audio applications and solutions.

18 Claims, 13 Drawing Sheets

(56) References Cited

U.S. PATENT DOCUMENTS

| | | |
|---|---|---|
| 2005/0195622 A1 | 9/2005 | Lehman et al. |
| 2006/0158359 A1 | 7/2006 | Magrath |
| 2009/0146737 A1 | 6/2009 | Guo et al. |
| 2009/0195068 A1 | 8/2009 | Ohashi et al. |
| 2010/0038972 A1 | 2/2010 | Buter et al. |
| 2010/0045376 A1 | 2/2010 | Soenen et al. |
| 2010/0090764 A1* | 4/2010 | Buter ............... H02M 3/07 330/251 |
| 2010/0097139 A1* | 4/2010 | Nielsen ............. H03F 1/32 330/251 |
| 2010/0165688 A1* | 7/2010 | Bendre ............. H02M 7/483 363/137 |
| 2010/0225391 A1 | 9/2010 | Kim |
| 2010/0231298 A1 | 9/2010 | Norimatsu et al. |

FOREIGN PATENT DOCUMENTS

| | | |
|---|---|---|
| EP | 2309638 A1 | 4/2011 |
| JP | 2002-521949 A | 7/2002 |
| JP | 2003-511005 A | 3/2003 |
| JP | 2004-072707 A | 3/2004 |
| JP | 2006-223009 A | 8/2006 |
| JP | 2007-067554 A | 3/2007 |
| JP | 2009-522881 A | 6/2009 |
| JP | 2009-177951 A | 8/2009 |
| JP | 2010-213114 A | 9/2010 |
| JP | 2001-502156 A | 2/2013 |
| WO | 01/24351 A1 | 4/2001 |
| WO | 2007/079396 A2 | 7/2007 |
| WO | WO 2008050273 A2 * | 5/2008 ............. H02M 3/07 |
| WO | 2011/126527 A1 | 10/2011 |

OTHER PUBLICATIONS

International Written Opinion corresponding to co-pending International Patent Application Serial No. PCT/EP2011/068873, European Patent Office, dated Mar. 14, 2012; (8 pages).

Office Action corresponding to co-pending Chinese Patent Application Serial No. 2011800631925, Chinese Patent Office, dated Apr. 22, 2015; (7 pages).

Office Action corresponding to co-pending Japanese Patent Application Serial No. 2013-535440, Japanese Patent Office, dated Jun. 16, 2015; (10 pages).

* cited by examiner a) 3-Level output b) 5-Level output a)

b)

AUDIO AMPLIFIER USING MULTI-LEVEL PULSE WIDTH MODULATION

CROSS-REFERENCE TO RELATED APPLICATIONS

This application is a U.S. National Stage of International Application No. PCT/EP2011/068873, filed Oct. 27, 2011, which claims the benefit of U.S. Provisional Patent Application No. 61/407,262, filed on Oct. 27, 2010, both of which are incorporated herein by reference in their entireties.

The present invention relates in one aspect to a class D audio amplifier with improved output driver topology supporting multi-level output signals such as 3-level, 4-level or 5-level pulse width or pulse density modulated output signals for application to a loudspeaker load. The present class D audio amplifiers are particularly well-suited for high-volume consumer audio applications and solutions.

BACKGROUND OF THE INVENTION

Class D audio amplifiers are a well-known type of audio power amplifier which generally is recognized to provide energy efficient audio drive of a loudspeaker load by switching a pulse width modulated (PWM) or pulse density modulated (PDM) audio signal across the loudspeaker load. Class D audio amplifiers typically comprises an H-bridge driver with a pair of output terminals coupled to respective sides or terminals of the loudspeaker load to apply an oppositely phased pulse width modulated or pulse density audio signals across the loudspeaker. Several modulation schemes for pulse width modulated audio signals have been utilized in prior art class D amplifiers. In so-called AD modulation, the pulse width modulated audio signal at each output terminal or node of the H-bridge is switched between or toggles between two different levels in opposite phase. The two different levels typically correspond to the upper and lower DC power supply rails, respectively, such as the positive and negative DC supply rails.

In so-called BD modulation, the pulse width modulated audio signal across the loudspeaker load is alternatingly switched between three levels of which two levels correspond to the above-mentioned upper and lower DC power supply rails and the third level is zero level that is obtained by either pulling both terminals of the loudspeaker load to one of the DC power supply rails at the same time.

While such prior art Class D amplifiers are often considered to be highly power efficient compared to traditional non-switching audio power amplifiers such as class A, B, and AB amplifiers, these prior art Class D amplifiers never the less consume considerable amounts of idle power when the audio input signal is small or close to zero level. The idle power consumption leads to poor power efficiency at such small audio input signals with efficiency figures far below the often quoted 90-100% power efficiency of prior art Class D amplifiers. Operation at the quoted power efficiency is only obtained for very large audio input signals while operation within typical levels of audio input signals leads to much poorer power efficiency. The relatively poor power efficiency at low level audio input signals are inter alia caused by the switching losses occurring in semiconductor switches of the H-bridge and a ripple currents induced in load inductors and ripple voltages induced in load capacitors. The load inductor and load capacitor are normally inserted between each of the output terminals or nodes of the H-bridge and the loudspeaker load to provide lowpass filtering of the "raw" pulse width or density modulated audio signal. The lowpass filtering is required to suppress large amplitude switching or carrier frequency components of the pulse width or density modulated audio signal and avoid thermal damage to the loudspeaker or induce various types of intermodulation distortion.

However, load inductors and load capacitors of appropriate size for prior art class D audio amplifiers are often so large that they must be provided as external components to an integrated circuit containing other functions and circuits of the class D audio amplifier. Consequently, the load inductors and load capacitors add to the costs of complete amplification solutions or assemblies for portable and stationary entertainment and communication equipment such as TV sets computer audio, Hi-Fi stereo amplifiers etc. Likewise, the external inductors and capacitors require allocation of valuable board space for amplification solutions and present a potential reliability source.

Another problem associated with prior art Class D audio amplifiers is the generation of excessive levels of EMI noise by the carrier or switching frequency associated with the pulse width or density modulated audio signals that comprises essentially rectangular pulses with repetition frequencies in a range between 250 kHz-2 MHz. The high level of EMI noise complicates integration of these prior art class D audio amplifiers with other types of signal processing circuits such as radio-frequency transmitters/receivers etc.

Accordingly, class D amplifiers with reduced levels of EMI noise are highly desirable. Likewise, class D amplifiers with improved power efficiency, especially at low audio input signals levels, are also highly advantageous. Finally, it is desirable to decrease the size of the external load inductors and load capacitors to provide more compact, power efficient, reliable and less costly amplification solutions for consumer and other types of audio products.

SUMMARY OF INVENTION

A first aspect of the invention relates to a class D audio amplifier comprising:
- a first output driver comprising an output node connectable to a loudspeaker load to supply a load signal thereto,
- said first output driver comprising an upper leg coupled between a first DC supply voltage and the output node and a lower leg coupled between the output node and a second DC supply voltage,
- the upper leg comprising a first semiconductor switch and a second semiconductor switch coupled in series and controlled by first and second switch control terminals, respectively,
- the lower leg comprising a third semiconductor switch and a fourth semiconductor switch coupled in series and controlled by third and fourth switch control terminals, respectively;
- a controller adapted to receive an audio input signal and derive first, second, third and fourth pulse width or pulse density modulated control signals there from. The controller is configured to apply the first, second, third and fourth pulse width or pulse density modulated control signals to the first, second, third and fourth switch control terminals, respectively; A first DC voltage source is configured to set a first predetermined DC voltage difference between a first node, located between the first and second semiconductor switches, and a second node, located between the third and fourth semiconductor switches.

The controller is preferably configured to provide the first and fourth pulse width or pulse density modulated control signals in opposite phase and non-overlapping when a modulation of the pulse width or pulse density modulated control signals is zero, i.e. the audio signal level is zero. Likewise, the second and third pulse width or pulse density modulated control signals preferably have opposite phase and are non-overlapping at zero modulation.

The class D amplifier may be configured to provide 3 output levels at the output node of the first driver if the predetermined DC voltage difference substantially equals one half of a DC voltage difference between the first and second DC supply voltages together with appropriate timing of the first, second, third and fourth pulse width or pulse density modulated control signals. According to this embodiment, the output levels at the output node of the first driver toggles between the first DC supply voltage, the predetermined DC voltage difference and the second DC supply voltage. The second DC supply voltage may be a ground voltage, GND, of the class-D amplifier or a negative DC supply voltage for example substantially equal in magnitude to the first DC supply voltage.

In another embodiment, the predetermined DC voltage difference differs from one half of the DC voltage difference between the first and second DC supply voltages so as to create a 4-level signal at the output node since the DC voltage source is alternatingly connected to the first DC supply voltage through the first semiconductor switch and to the second DC supply voltage through the fourth semiconductor switch. A significant advantage of the present class D audio amplifier over classic AD and BD pulse width modulation is a suppression or attenuation of common mode ripple voltage across the loudspeaker load and output filter components. This common mode ripple voltage is an unwanted residue of the switching or modulation frequency of the pulse width modulated carrier. Another other advantage is a lower output filter inductor ripple current and output filter capacitor ripple voltage at small modulation duty cycles corresponding to small levels of the audio input signal.

The first output driver may be adapted to operate across a wide range of DC supply voltages, i.e. a voltage difference between the first and second DC supply voltages, depending on requirements of a particular application. In a range of useful applications, the DC supply voltage may be set to value between 5 Volt and 120 Volt. The DC supply voltage difference may be provided as a unipolar or bipolar DC voltage for example +5 Volt or +/−2.5 Volt relative to a ground reference, GND.

It is a significant advantage of the present class D audio amplifier that the DC voltage difference between the first and second DC supply voltages is divided between at least two series coupled semiconductor switches of the upper leg or (such as the first and second semiconductor switches), or between at least two series coupled semiconductor switches of the lower leg (such as the third and fourth semiconductor switches), thus reducing breakdown voltage requirements of the semiconductor switches.

The first output driver may utilize different types of semiconductor switches depending on requirements of any particular application for example low voltage or high voltage application. Each of the first, second, third and fourth semiconductor switches preferably comprises one or several parallel, transistors selected from a group of {Field Effect Transistors (FETs), bipolar Transistors (BJTs), Insulated Gate Bipolar Transistors (IGBTs)}. The first, second, third and fourth semiconductor switches preferably comprises respective CMOS transistor switches. The entire class D audio amplifier is preferably integrated on a CMOS or BCD semiconductor die or substrate to provide a robust and low-cost single chip solution which is particularly well-suited for high-volume consumer oriented audio applications, such as TV sets, mobile phones and MP3 players, where cost is an essential parameter.

According to a preferred embodiment of the invention, the controller of the class-D audio amplifier further comprises:

an analog pulse width modulator coupled to receive an analog audio input signal and generate a naturally sampled (i.e. analog) pulse width modulated audio signal. A sampling device or circuit operating in accordance with a digital clock signal and adapted to generating a uniformly sampled pulse width or pulse density modulated audio signal based on the naturally sampled pulse width modulated audio signal. The controller is adapted to generating the first, second, third and fourth pulse width modulated control signals based on the uniformly pulse width modulated audio signal. The quantization error associated with the conversion of the naturally sampled pulse width modulated audio signal into the uniformly sampled pulse width modulated audio signal may be reduced to any desirable level by selecting an appropriate frequency of the digital clock signal which sets a sampling frequency of the naturally sampled pulse width modulated audio signal. However, in many situations it may be impractical to use a sufficiently high sampling frequency to reach a desired magnitude of quantization error. Another preferred embodiment of the invention therefore comprises a feedback path extending from the load signal to a summing node positioned in front of the analog pulse width modulator and a loop filter such as a first, second or third order low pass filter, inserted in the feedback path to shape a spectrum of quantization noise generated by sampling of the naturally sampled pulse width modulated audio signal. The shaping of the spectrum of the quantization noise translates or moves a significant portion of this noise to a frequency range above a desired audio band (for example above 10 kHz, 16 kHz or 20 kHz) where the quantization noise is inaudible and easily can be suppressed by appropriate filtering. Another significant advantage of the feedback loop is its suppression of output signal errors introduced by non-ideal switching operation of one or more of the first, second, third and fourth semiconductor switches.

In some embodiments, the load signal is sensed at the output node of first output driver, or between first and second output nodes of a H-bridge driver having first and second output drivers, while in other embodiments the load signal is sensed at the loudspeaker load terminal after a lowpass filtering output filter (typically comprising a series coupled load inductor and a shunt coupled load capacitor) inserted between the output node and the loudspeaker load.

Another preferred embodiment of the class D audio amplifier is adapted to receive and process a digital audio input signal such as a PCM digital audio signal. According to this embodiment, the controller of the class-D audio amplifier further comprises a PCM to PWM converter coupled to receive a digital audio input signal and generate a quantized uniformly sampled pulse width modulated audio signal. A noise shaper is adapted to filtering the quantized uniformly sampled pulse width modulated audio signal to suppress quantization noise therein. A switch controller is adapted to generating the first, second, third and fourth pulse width modulated control signals based on the quantized uniformly pulse width modulated audio signal.

A particularly advantageous embodiment of the invention comprises a pair of cooperating and substantially identical output drivers which form an H-bridge output driver having the first and second output nodes operatively connectable to opposite sides or terminals of the loudspeaker load to supply a load signal thereto. Consequently, there is provided a class D audio amplifier further comprising: a second output driver comprising the second output node connectable to the loudspeaker load to supply a second load signal there to. The second output driver comprising an upper leg coupled between the first DC supply voltage and the second output node and a lower leg coupled between the second output node and the second DC supply voltage. The upper leg comprises a fifth semiconductor switch and a sixth semiconductor switch coupled in series and controlled by fifth and sixth switch control terminals, respectively. The lower leg comprises a $7^{th}$ semiconductor switch and an $8^{th}$ semiconductor switch coupled in series and controlled by $7^{th}$ and $8^{th}$ switch control terminals, respectively; A second DC voltage source is configured to set a second predetermined DC voltage difference between a third node, situated between the fifth and sixth semiconductor switches, and a fourth node, situated between the $7^{th}$ and $8^{th}$ semiconductor switched. The controller is adapted to derive fifth, sixth, $7^{th}$ and $8^{th}$ pulse width modulated control signals from the audio input signal and apply these to the fifth, sixth, $7^{th}$ and $8^{th}$ switch control terminals, respectively. The first and the second predetermined DC voltage difference are preferably substantially identical.

The second output driver may of course include any individual feature or any combination of the individual features described in connection with the above-described embodiments of the first output driver.

In an embodiment of the invention, the controller comprises a Digital Signal Processor (DSP) for example in form of a programmable for example software programmable DSP or a hardwired customized DSP based on an ASIC or an appropriately configured Field Programmable Logic Array (FPGA). If the controller comprises the software programmable DSP, a non-volatile memory space located within an EEPROM or flash-memory device may comprise appropriate program instructions or routines to generate the respective switch control signals for the first, second, third and fourth semiconductor switches as well as other functions.

The respective switch control signals for the first, second, third and fourth semiconductor switches may be generated by a suitable DSP program/algorithm and applied directly, or through a predriver circuit, to individual semiconductor switches. In a number of applications, the driver circuit may comprise a pulse width modulated signal with a predetermined switching or modulation frequency between 250 kHz and 2 MHz. In this embodiment, the first and second driver outputs may apply a PWM or PDM modulated output signal to the load. Generally, the switching frequency or modulation frequency of each of the first, second, third and fourth pulse width modulated control signals preferably lies between 150 kHz and 5 MHz even more preferably between 500 kHz and 1 MHz.

In one embodiment of the present invention, the controller operates according to a master clock signal generated by a master clock generator. The master clock signal may be significantly higher than the switching frequency of the first, second, third and fourth pulse width modulated control signals such as between 10 and 100 times higher. The switch control signals or control signals for the respective semiconductor switches may be operated synchronously to the master clock signal.

In one embodiment of the class D audio amplifier, a switch controller is adapted to perform redundant state selection balancing to maintain the predetermined DC voltage difference between the first and second nodes of the first output driver. During operation of the class D audio amplifier, a current value of the first predetermined DC voltage difference may be compared to a reference DC voltage representing a desired or target value of the first predetermined DC voltage difference. The first predetermined DC voltage difference may be adjusted up or down if it deviates by more than a pre-set voltage from the reference DC voltage. The reference DC voltage may be produced in various ways such as by a resistive or capacitive voltage divider coupled between the first and second DC supply voltages.

In an embodiment, the first, second, third and fourth pulse width modulated control signals are configured to:
in a first state, connecting a first terminal of the DC voltage source to the output node through the first and third semiconductor switches. In a second state, connecting a second terminal of the DC voltage source to the output node through the fourth and second semiconductor switches. The first and third semiconductor switches are placed simultaneously in their respective conducting states or on-states by the respective pulse width modulated control signals so as to effectively electrically connect the first terminal of the DC voltage source to the output node. Due to the opposite phase and non-overlapping relationship between the first and fourth pulse width modulated control signals and the second and third pulse width control signals, the second and fourth semiconductor switches are placed simultaneously in their respective non-conducting or off-states during the first phase so as to disconnect the second DC supply voltage and a second terminal of the DC voltage source from the output node. In the second state, the respective states of the semiconductor switches are reversed whereby the second terminal of the DC voltage source is electrically connected to the output node.

When the present class D audio amplifier comprises an H-bridge output driver, it may be adapted to provide different numbers of output levels dependent on a phase relationship between corresponding pulse width modulated control signals of the first output driver and the second output driver. A 3-level load signal embodiment of the present class D audio amplifier may be created by adapting the controller to generate the fifth, sixth, $7^{th}$ and $8^{th}$ pulse width modulated control signals in substantially opposite phase to the first, second, third and fourth pulse width modulated control signals, respectively, for zero modulation of the pulse width modulated control signals.

Another useful H-bridge based embodiment of the present class D audio amplifier with a multi-level output signal may be created by adapting the controller to generate the fifth, sixth, $7^{th}$ and $8^{th}$ pulse width modulated control signals with opposite phase and an additional +/−90 degrees phase shift relative to the first, second, third and fourth pulse width modulated control signals, respectively, to generate a 5-level load signal across the loudspeaker load. In this manner, the fifth pulse width modulated control signal may be derived from the first pulse width modulated control signal may inverting and phase shifting the latter by +/−90 degrees and so on for the second and sixth pulse width modulated control signals, the third and $7^{th}$ pulse width modulated control signals and the fourth and $8^{th}$ pulse width modulated control signals.

Another advantageous effect is achieved by further adapting the controller so as to:

altering a switching or modulation frequency of each of the first, second, third and fourth, fifth, sixth, $7^{th}$ and $8^{th}$ pulse width modulated control signals depending on the detected level of the audio signal. In one embodiment, the switching frequency is reduced from a first frequency between 300 kHz-800 kHz to a second frequency less than 200 KHz, such as about 150 kHz, when the detected level of the audio signal drops below the above-described predetermined level threshold. The lowering of the switching frequency for audio input signals below the predetermined level threshold may lead to a reduction of the power loss in the semiconductor switches since power loss is approximately proportional to switching frequency for many common types of MOS transistor based semiconductor switches.

Each of the first and second output drivers may comprise one or more additional pair(s) of semiconductor switches. An additional semiconductor switch of the additional pair of semiconductor switches may be placed in the upper leg of the first output driver in series with the first and second semiconductor switches and another semiconductor switch placed in the lower leg in series with the third and fourth semiconductor switches. A second or third DC voltage source is provided and connected to coupling nodes between the additional semiconductor switches and the first and fourth semiconductor switches. The skilled person will understand that further pairs of semiconductor switches and DC voltage sources may be added to the first or second output drivers in a corresponding manner to provide even further output levels. Consequently, in one such embodiment the present class D audio amplifier, the first output driver comprises a total of 6 cascaded semiconductor switches such that the upper leg of the first output driver comprises a $5^{th}$ or $9^{th}$ semiconductor switch coupled in series with the first semiconductor switch ($9^{th}$ applies for H-bridge output driver implementation) and the first DC supply voltage and the lower leg of the first output driver comprises a $6^{th}$ or $10^{th}$ semiconductor switch ($10^{th}$ applies for H-bridge output driver implementation) coupled in series with the fourth semiconductor switch and the second DC supply voltage. A second or third DC voltage source (third applies for H-bridge output driver implementation) is configured to set a second or third predetermined DC voltage difference between a third or $5^{th}$ node, located between the $5^{th}$ or $9^{th}$ semiconductor switch and the first semiconductor switch, and a $4^{th}$ or $6^{th}$ node, located between the $6^{th}$ or $10^{th}$ semiconductor switch and the $4^{th}$ semiconductor switch, and, optionally:

wherein the upper leg of the second output driver comprises an $11^{th}$ semiconductor switch coupled in series with the $5^{th}$ semiconductor switch and the first DC supply voltage and the lower leg of the second output driver comprises a $12^{th}$ semiconductor switch coupled in series with the $8^{th}$ semiconductor switch and the second DC supply voltage; and a fourth DC voltage source configured to set a fourth predetermined DC voltage difference between a $5^{th}$ node, located between the $11^{th}$ semiconductor switch and the $5^{th}$ semiconductor switch, and $6^{th}$ node, located between the $8^{th}$ and $12^{th}$ semiconductor switches.

Preferably, at least one of the first, second, third and fourth DC voltage sources comprise at least one component from a group of {a charged capacitor, a floating DC supply rail, a battery}. In many embodiments, respective charged capacitors often referred to as "flying capacitors" may be convenient types of electrical components to provide all of the DC voltage sources required in a particular class D amplifier topology or embodiment. Since the DC voltage sources are only required to deliver a very small amount of energy during operation of the class D audio amplifier, and linearity requirements are relaxed, capacitors of limited capacitance and physical size can be used as flying capacitors. In a number of embodiments, one or more of the first, second, third or fourth DC voltage sources comprises a charged capacitor or flying capacitor; each charged capacitor having a capacitance between 100 nF and 10 µF.

A second aspect of the invention relates to a class D audio amplifier comprising: a first output driver and a second output driver comprising first and second output nodes connectable to respective inputs of a loudspeaker load to supply a load signal thereto. The first output driver comprises one or more semiconductor switches coupled between a first supply voltage and the first output node and one or more semiconductor switches coupled between the first output node and a second supply voltage. The first output driver additionally comprising one or more semiconductor switches coupled between the first output node and a third supply voltage. The second output driver comprises one or more semiconductor switches coupled between the first supply voltage and the second output node and one or more semiconductor switches coupled between the second output node and the second supply voltage. The second output driver additionally comprises one or more semiconductor switches coupled between the second output node and the third supply voltage. Each of the one or more semiconductor switches comprises a switch control terminal adapted to control a state of the semiconductor switch to selectively place each semiconductor switch in its on-state or off-state. A controller is adapted to receive an audio input signal and derive a first set of modulated control signals therefrom. The controller applies the first set of modulated control signals to respective switch control terminals of the first driver. The controller is further adapted to derive a second set of modulated control signals, having a predetermined phase relationship to the first set of modulated control signals, and apply the second set of modulated control signals to respective switch control terminals of the second driver. The controller is additionally configured to:

in a first operation mode, set a first predetermined phase relationship between the first and second sets of modulated control signals to generate a first multi-level load signal across the loudspeaker load, in a second operation mode, set a second predetermined phase relationship between the first and second sets of modulated control signals to generate a second multi-level load signal across the loudspeaker load.

The ability of the Class D audio amplifier to switch between different multi-level load signals via the first and second operation modes allows optimization of the trade-off between power efficiency and EMI noise generation. At high output power levels of the Class D audio amplifier, the generation of common mode signals across the loudspeaker load may be minimized by selecting a low number of levels, preferably three levels where the sum of output signals on the first and second output nodes is substantially constant. On the other hand, at low output power levels of the Class D audio amplifier, the generation of EMI noise by switching of the semiconductor switches is reduced, and this permits the use of a higher number of levels across the loudspeaker load despite a substantial difference in the sum of the output signals on the first and second output nodes. The threshold between high and low output power levels may be set or defined by a predetermined level threshold of the audio input signal as discussed below in additional detail. The higher number of levels at the low output power level allows the switching frequency of the modulated controls signals of the semiconductor switches to be reduced, leading to a better power efficiency of the Class D audio amplifier at low output power levels.

The first multi-level load signal preferably comprises fewer levels than the second multi-level load signal. In one embodiment the first multi-level load signal is a three-level load signal and the second multi-level load signal is a five-level load signal. This embodiment can be implemented in output driver topologies with a relatively low number of semiconductor switches and with only three different supply voltages such a positive and negative DC supply voltage and a mid-point voltage as discussed in further detail below.

The skilled person will understand that a N-level load signal can be generated from a set of modulated control signals with (N−1) different control signal phases having a phase difference of 360/(N−1) degrees. A three-level load signal is provided by setting N=3=>N−1=2 different control signal phases=>360/(3−1)=180 degrees phase shifted. Likewise, a five-level load signal is provided by setting N=5=>N−1=4 different control signal phases=>360/(5−1)=90 degrees phase shifted. Furthermore, a seven-level load signal is provided by setting N=7=>N−1=6 different control signal phases=>360/(5−1)=60 degrees phase shifted and so on. N being a positive integer number, preferably an uneven integer number.

Preferably, each of the modulated control signals of the first and second sets of modulated control signals comprises a pulse width modulated control signal or each of the modulated control signals of the first and second sets of modulated control signals comprises a pulse density modulated control signal. The respective amplitudes or levels of the modulated control signals such as each of the first, second, third and fourth pulse width modulated control signals, or each control signal of the first set and/or second set of modulated control signals, are preferably sufficiently large to selectively place the semiconductor switch in question in either an on-state/closed state or an off-state/open state. In some embodiments, the controller and/or the first and second drivers may comprise one or more level converters configured to raise respective amplitudes of the modulated control signals from a first amplitude to a second amplitude higher or larger than the first amplitude. The second amplitude is preferably sufficiently high to drive each of the semiconductor switches into its on-state when needed. In the on-state or ON, the semiconductor switch preferably exhibits a low resistance, such as less than 10Ω, or more preferably less than 1Ω, between a pair of controlled switch terminals, such as drain and source terminals of a MOS transistor. In the off-stat or OFF, the semiconductor switch preferably exhibits a large resistance, such as above 1 MΩ or several MΩ, between the pair of controlled terminals. The on-resistance of a semiconductor device is generally determined by its process of manufacture and its geometry. For semiconductor switches implemented as CMOS transistors the relevant geometrical parameter is the width-to-length (W/L) ratio of the CMOS transistor. PMOS transistors of CMOS semiconductor processes generally exhibit an on-resistance which is 2-3 times larger than an on-resistance of a NMOS transistor with similar dimensions and manufactured in the same semiconductor process. Generally, an on-resistance of each of the semiconductor switches preferably lies between 0.05Ω and 10Ω.

The first and second output drivers may be adapted to operate across a wide range of supply voltages, i.e. the supply voltage difference between the first and second supply voltages, depending on requirements of a particular application. The first supply voltage may be a positive DC supply voltage and the second supply voltage may be a negative DC supply voltage or a ground reference. In a range of useful applications, the supply voltage difference may be set to a DC voltage between 5 Volt and 120 Volt.

According to a preferred embodiment, the controller is configured to:
  in the first operation mode, providing each control signal of the second set of modulated control signals with opposite phase relative to a corresponding control signal of the first set of modulated control signals to generate a three-level load signal,
  in the second operation mode, providing each control signal of the second set of modulated control signals with opposite phase and an additional +/−90 degrees phase shift relative to a corresponding control signal of the first set of modulated control signals to generate a five-level load signal. In this manner a well-controlled phase shift is set between control signals of corresponding semiconductor switches of the first and second output drivers, i.e. semiconductor switches with the same position in the output driver topology.

According to yet another useful embodiment of the present class D audio amplifiers, the controller comprises an audio signal level detector. The controller is adapted to switch between the first and second operation modes depending on a detected level of the audio input signal. The level of the audio input signal may be determined directly by determination or measurement of an average, peak, peak-to-peak, RMS etc. level of the audio input signal. Alternatively, the level of the audio input signal may be determined indirectly for example through a detection of a modulation index, or modulation duty cycle of one or more pulse width modulated control signals such as one of the first, second, third and fourth pulse width modulated control signals or a signal derived therefrom.

In one preferred embodiment, the controller is further adapted to compare the detected level of the audio input signal with a predetermined level threshold and change between the first and second operation modes depending on an outcome of the comparison. The controller compares the detected level of the audio input signal with a predetermined level threshold and selects the first operation mode when the detected audio signal level exceeds the predetermined level threshold. The controller selects the second operation mode when the detected audio signal level is smaller than the predetermined level threshold. A significant advantage of this embodiment is an acceptable level of common-mode load capacitor ripple voltage in combination with a possibility to reduce the switching frequency of the modulated control signals. The reduced switching frequency leads to an advantageous lowering of power losses in the semiconductor switches and their associated control terminal driving circuitry such as gate driver circuitry.

The switching or modulation frequency of each of the modulated control signals of the first set of modulated control signals and the second set of modulated control signals may be altered depending on the detected level of the audio signal. In one embodiment, the switching frequency is reduced from a first frequency range between 300 kHz and 800 kHz to a second frequency range below 200 KHz, such as below 150 kHz, when the level of the audio signal drops below the above-described predetermined level threshold.

According to preferred embodiment of the class D audio amplifier, the first output driver comprises:
- a first and a second semiconductor switch coupled in series between the first supply voltage and the first output node,
- a third and a fourth semiconductor switch coupled in series between the second supply voltage and the first output node.

The second output driver comprises:
- a fifth and a sixth semiconductor switch coupled in series between the first supply voltage and the second output node,
- a seventh and an eight semiconductor switch coupled in series between the second supply voltage and the second output node;
- third supply voltage source configured to generate the third supply voltage. The third supply voltage source comprises:
- a first DC voltage source configured to set a first predetermined DC voltage difference between a first node, located between the first and second semiconductor switches, and a second node, located between the third and fourth semiconductor switches,
- a second DC voltage source configured to set a second predetermined DC voltage difference between a third node, situated between the fifth and sixth semiconductor switches, and a fourth node, situated between the $7^{th}$ and $8^{th}$ semiconductor switches. In this embodiment, the first DC voltage source preferably comprises a first charged capacitor and the second DC voltage source preferably comprises a second charged capacitor. As explained above in connection with the first aspect of invention, the first and second charged capacitors or "flying capacitors" are convenient types of electrical components to provide the third supply voltage in a class D amplifier topology or embodiment. In the present embodiment, the third supply voltage is only required to deliver a small amount of energy during operation of the class D audio amplifier. Furthermore, since linearity requirements are relaxed, capacitors of limited capacitance and physical size can be used as the first and second flying capacitors. In some embodiments, the flying capacitors may each have a capacitance between 100 nF and 10 µF.

According to another embodiment of the class D audio amplifier, the first output driver comprises:
- a first and a second semiconductor switch coupled in series between the first supply voltage and the first output node,
- a third and a fourth semiconductor switch coupled in series between the second supply voltage and the first output node; The second output driver comprises:
- a fifth and a sixth semiconductor switch coupled in series between the first supply voltage and the second output node,
- a seventh and an eight semiconductor switch coupled in series between the second supply voltage and the second output node. A third supply voltage source is configured to generate the third supply voltage and comprises:
- a pair of supply capacitors coupled in series between the first supply voltage and the second supply voltage to provide a mid-point voltage,
- a first diode coupled between the mid-point voltage and a node between the first and second semiconductor switches,
- a second diode coupled between the mid-point voltage and a node between the third and fourth semiconductor switches,
- a third diode coupled between the mid-point voltage and a node between the fifth and sixth semiconductor switches,
- a fourth diode coupled between the mid-point voltage and a node between the seventh and eight semiconductor switches.

Another embodiment of the class D audio amplifier, comprises:
- a third supply voltage source configured to generate the third supply voltage and comprising:
- a pair of supply capacitors coupled in series between the first supply voltage and the second supply voltage to provide a mid-point voltage. The first output driver comprises:
- a first semiconductor switch coupled in series between the first supply voltage and the first output node,
- a second semiconductor switch coupled in series between the second supply voltage and the first output node,
- a third second semiconductor switch coupled between the mid-point voltage and the first output node. Furthermore, the second output driver comprises:
- a fourth semiconductor switch coupled in series between the first supply voltage and the second output node,
- a fifth semiconductor switch coupled in series between the second supply voltage and the second output node,
- a sixth semiconductor switch coupled between the mid-point voltage and the first output node.

A third aspect of the invention relates to a sound reproducing assembly comprising a class D audio amplifier according to any of the above-described aspects and embodiments thereof, and a loudspeaker load operatively coupled to the output node of the first driver and one of the first and second DC supply voltages where the second DC supply voltage may be GND. Alternatively, the sound reproducing assembly may comprise H-bridge based class D audio amplifiers having first and second output drivers as outlined above where the loudspeaker load is operatively coupled in-between respective output nodes of the first and second output drivers. The loudspeaker load may comprise any type of moving coil (dynamic), moving armature, piezoelectric, electrostatic type of audio speaker. The sound reproducing assembly is preferably shaped sized for integration with stationary or portable entertainment products such as TV sets, computers, Hi-Fi equipment etc.

The sound reproducing assembly may further comprise a load inductor coupled between the output node of the first driver and the loudspeaker load and a load capacitor coupled between the loudspeaker load and one of the first and second DC supply voltages. The load inductor and capacitor form in combination a lowpass filter to suppress high frequency components associated with the switching frequency of the pulse width or pulse density modulated output signals at the output node or output nodes. A cut-off frequency of this lowpass filter may be above the audio band such as between 20 kHz and 100 kHz by appropriate choice of component values of the load inductor and capacitor.

BRIEF DESCRIPTION OF THE DRAWINGS

A preferred embodiment of the invention will be described in more detail in connection with the appended drawings, in which.

DETAILED DESCRIPTION OF PREFERRED EMBODIMENTS

Figure 1:
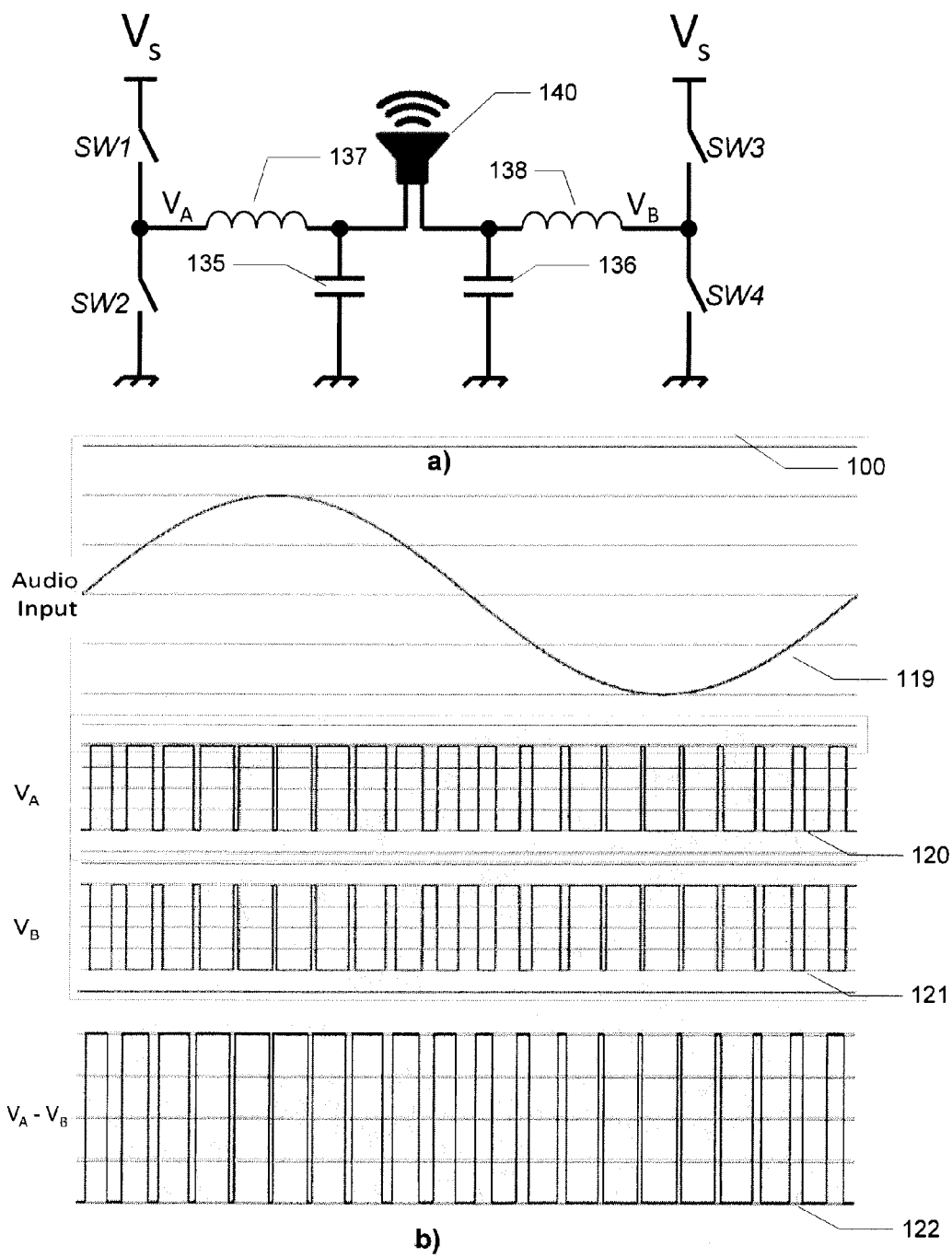
FIG. 1 illustrates an H-bridge driver coupled to a loudspeaker load and pulse width modulated output signal waveforms of the H-bridge driver according to a first type of prior art class D amplifier utilizing AD modulation.

FIG. 1 illustrates schematically an H-bridge output driver 100 coupled to a loudspeaker load 140. Pulse width modulated output signal waveforms 120, 121 are provided at respective output nodes VA, VB of the H-bridge output driver. The illustrated prior art class-D amplifier utilizes so-called AD modulation where the loudspeaker load is alternatingly connected between a positive DC supply voltage $V_S$ and a negative DC supply voltage, such as GND, and vice versa in accordance with respective switch control signals applied to control terminals (not shown) of semiconductor switches SW1, SW2, SW3 and SW4. The alternating switching of the loudspeaker load between $V_S$ and GND as illustrated by output signal waveform 122 is obtained by in a first phase setting SW1 and SW4 to respective ON or conductive states and SW2 and SW3 to respective OFF states or off-states. In a second phase, SW1 and SW4 are set to respective OFF or non-conducting states and SW2 and SW3 to respective on-states. The audio input signal waveform that corresponds to the pulse width modulated output signal waveforms is illustrated by waveform 119.

Load inductors 138, 137 are coupled between respective output nodes VA, VB of the H-bridge output driver 100 and each side of the loudspeaker load 140. Likewise, load capacitors 136, 135 are coupled from each terminal or side of the loudspeaker load to GND. The combined operation of the load capacitors and load inductors is to provide lowpass filtering of the pulse width modulated output signal waveforms 120, 121 at output nodes VA and VB to suppress carrier or switching frequency components in the loudspeaker drive or load signal.

Figure 2:
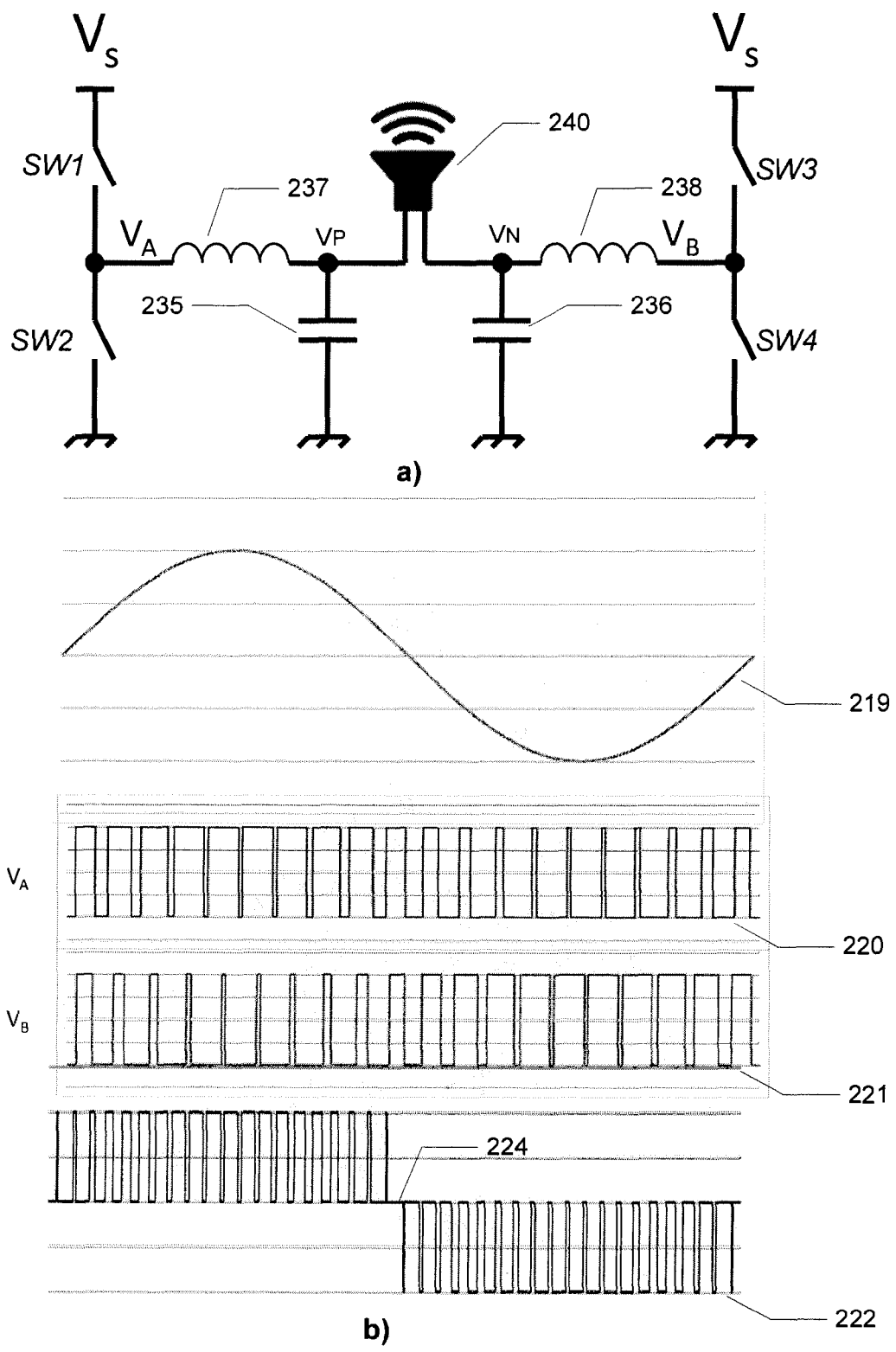
FIG. 2 illustrates an H-bridge driver for class D audio amplifiers coupled to a loudspeaker load and pulse width modulated output signal waveforms of the H-bridge driver according to a second type of prior art class D amplifier utilizing BD modulation.

FIG. 2 illustrates another prior art H-bridge output driver with similar topology to the H-bridge driver illustrated in FIG. 1 and coupled to the loudspeaker load 240. However, the present prior art class D amplifier utilizes so-called BD modulation. In class BD modulation, zero states exist which involve setting the output nodes VA and VB to the same state or voltage simultaneously, i.e. $V_S$ or GND, during certain time intervals. In the zero state both ends or terminals of the loudspeaker load 240 are simultaneously coupled or connected to either $V_S$ or to GND so as to set the driving voltage across the loudspeaker load 240 to zero. Consequently, when the level of the audio input signal is close to zero, switching of the pulse width modulated output waveforms 120, 121 at respective output nodes $V_A$, $V_B$ is discarded. This is illustrated in the pulse width modulated output waveform 222 at time instance marked by reference numeral 224 where the amplitude of the audio input signal 219 crosses zero. However, despite the presence of states with zero-differential voltage across the loudspeaker load it is important to notice that there only exists two different states or levels at each of the output nodes $V_A$, $V_B$ of the output driver, i.e. $V_S$ or GND.

Figure 3:
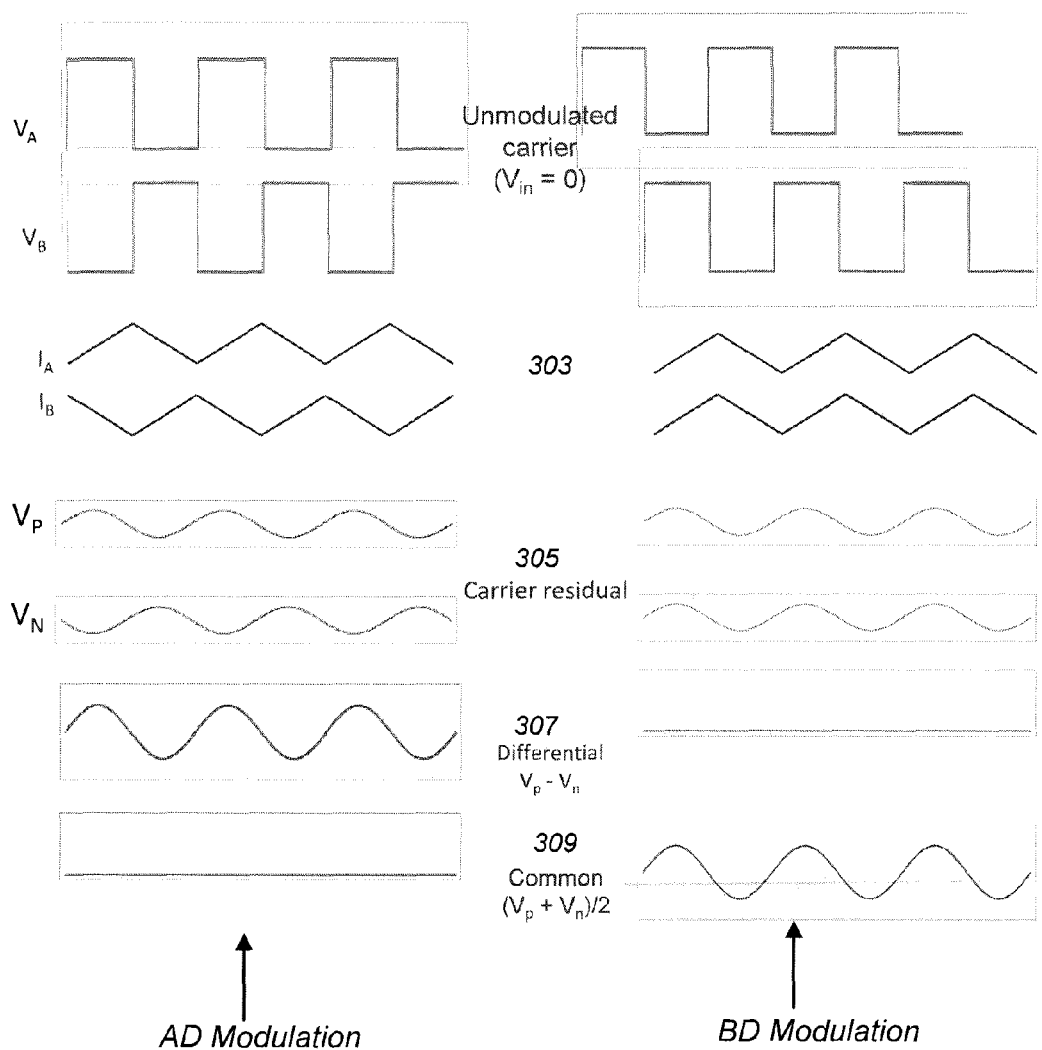
FIG. 3 illustrates load inductor ripple current waveforms and load capacitor ripple voltage waveforms for the prior art Class D amplifiers depicted on FIGS. 1 and 2, FIGS. 4a) and 4b) are schematic diagrams of a single-ended output driver and an H-bridge output driver, respectively, for class D audio amplifiers coupled to loudspeaker loads in accordance with a first embodiment of the invention.

FIG. 3 illustrates inter alia load inductor ripple current waveforms and load capacitor ripple voltage waveform for the prior art Class D amplifiers depicted on FIGS. 1 and 2. The waveforms illustrated in FIG. 3 correspond to a situation with zero level or amplitude of the audio input signal such that modulation of the pulse width modulated output waveforms at the first and second output nodes $V_A$, $V_B$ is zero. The waveforms on the left hand side of the drawing correspond to AD modulation as outlined above in connection with FIG. 1 while the right hand side waveforms depict the same voltage or current variables for class BD modulation as outlined above in connection with FIG. 2. The respective load inductor ripple current waveforms on waveform plots 303 reflect the integrating function of the load inductors 237, 238 and 137, 138 on the rectangular carrier waveform. The approximate sine-shaped load capacitor ripple voltage waveforms $V_P$ and $V_N$ on waveform plots 305 measured at the respective input terminals of the loudspeaker load reflect the lowpass filtering effect of the load capacitors 235, 236 and 135, 136 on the rectangular carrier waveforms. It is interesting to notice, that while the load capacitor ripple voltage waveforms $V_P$ and $V_N$ are of substantially identical amplitudes for class AD and class BD modulation, a differential ripple voltage, i.e. $V_P$ minus $V_N$, across the loudspeaker load as illustrated by waveforms 307 differs. For class AD modulation, the differential ripple voltage is twice the individual capacitor ripple voltages while the differential ripple voltage is about zero for class BD modulation. The lower level of ripple voltage for class BD modulation indicates a lower power loss in connection with the application of the pulse width modulated carrier waveforms to the loudspeaker load. However, despite the approximately zero differential ripple voltage across the loudspeaker load for class BD modulation, there still exist a significant common mode differential voltage as illustrated on common mode waveform plots 309 which leads to a power loss for this type of modulation. This is caused by load currents which are cycled back and forth through the load inductors causing power loss in a practical class D amplifier because real inductors possess inherent resistive and hysteresis losses.

Figure 4:
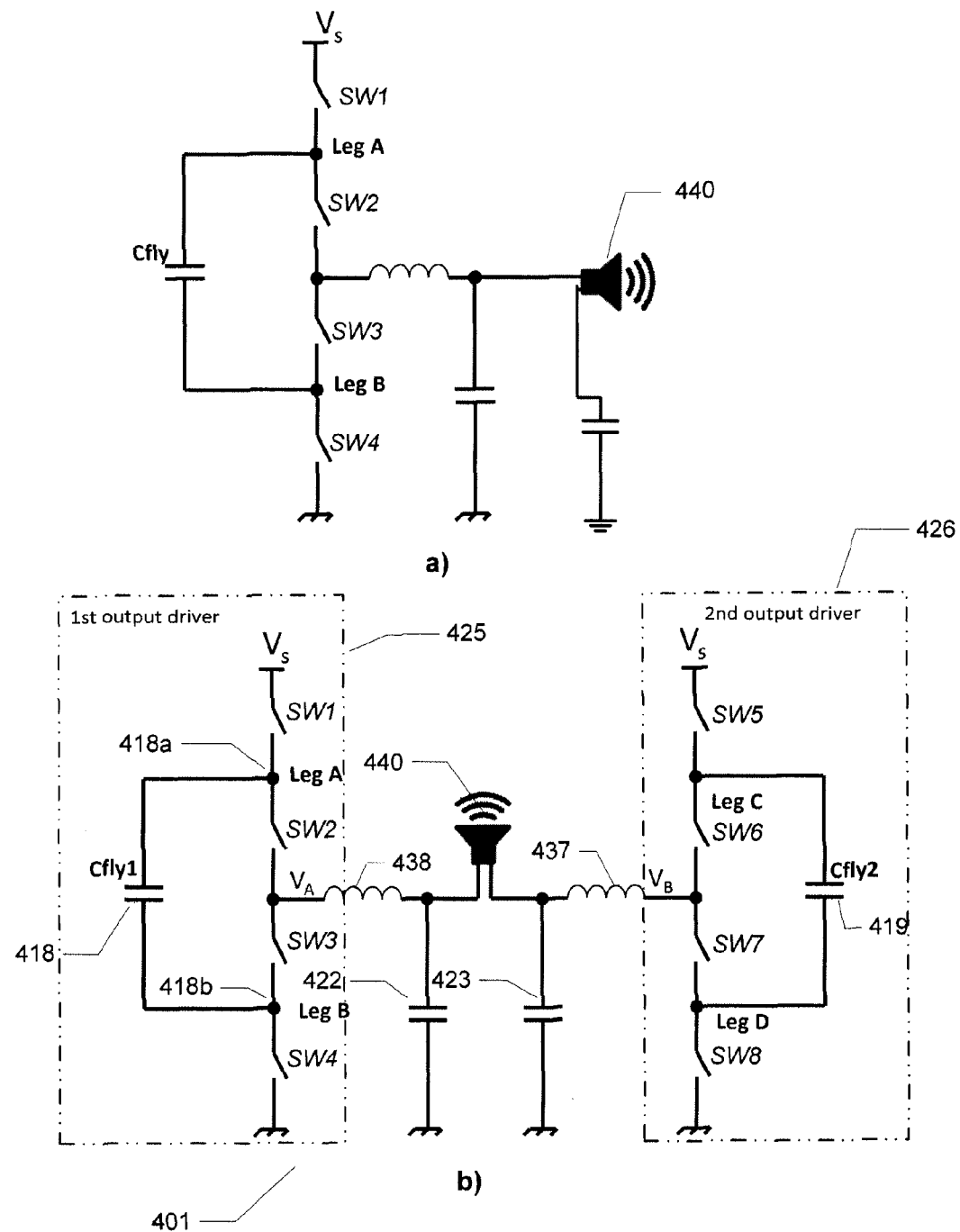
Figure 5:
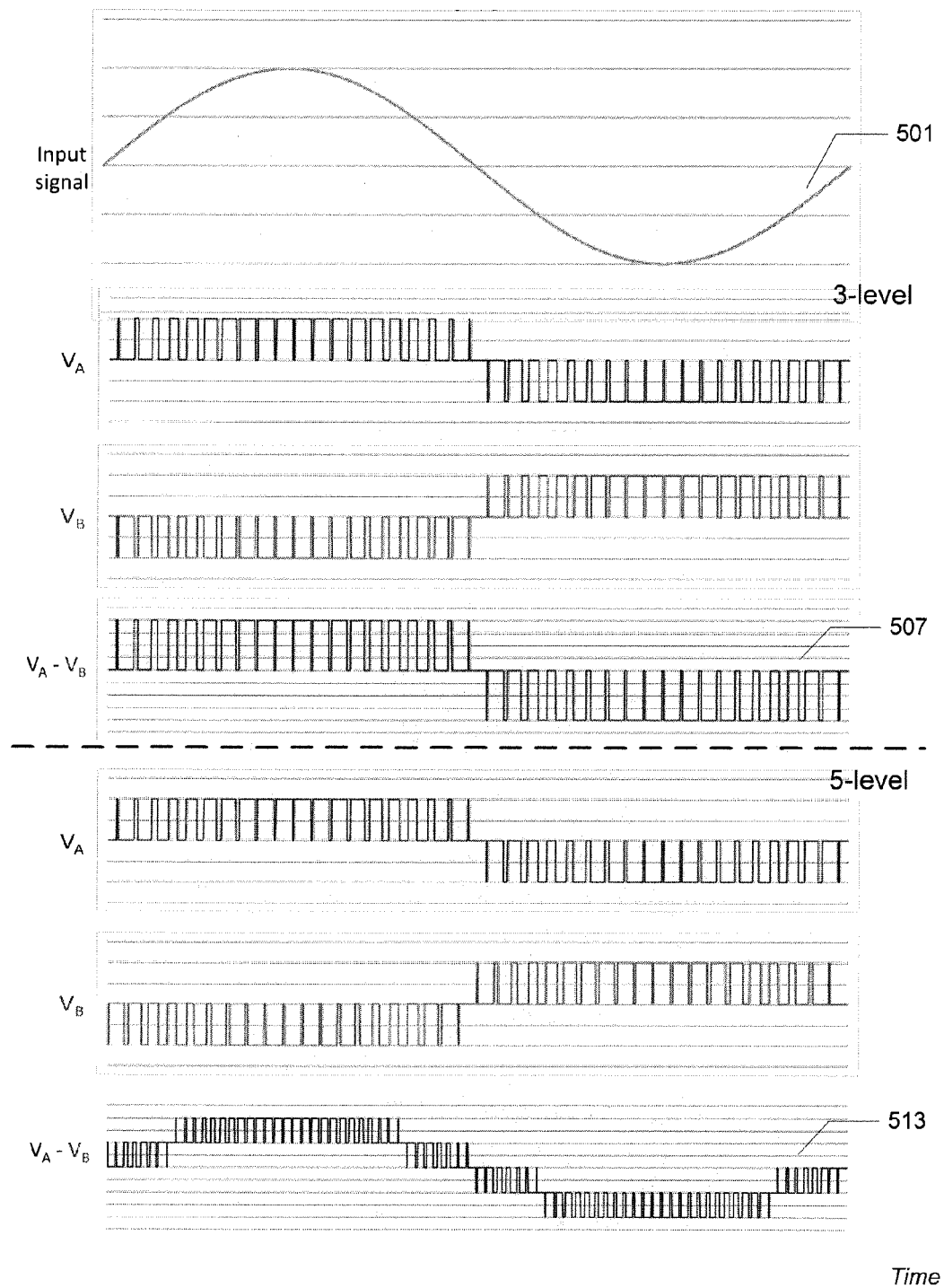
FIG. 5 illustrates three-level and five-level pulse width modulated output signal waveforms of the H-bridge output driver depicted on FIG. 4b)

FIGS. 4a) and 4b) illustrate a single-ended output driver and an H-bridge output driver, respectively, coupled to a loudspeaker load 440 in accordance with first preferred embodiments of the invention. The operation of the H-bridge output driver 401 where the loudspeaker load is operatively interconnected between a pair of output nodes $V_A$ and $V_B$ is explained in detail below while pulse width modulated load waveforms or signals at the first and second output nodes $V_A$ and $V_B$ are illustrated on FIG. 5 according to two different operating modes of a controller (not shown) adapted to generate the pulse width modulated switch control signals. In the first operation mode, a load signal with 3-level modulation is generated while a load signal with 5-level modulation is generated in the second operating mode.

In FIG. 4b), the H-bridge output driver 401 is operatively coupled to the loudspeaker load 440. The H-bridge output driver 401 comprises first and second substantially identical output drivers 425, 426, respectively. Each of the output drivers comprises four cascaded CMOS transistor switches, for example NMOS transistor, coupled between an upper DC supply voltage or rail $V_S$ and a lower DC supply voltage or rail in form of ground or GND rail. Furthermore, each output driver 425, 426 comprises a charged so-called flying capacitor $C_{fly1}$, $C_{fly2}$ 418, 419 that enable the generation of a third output level or mid-point voltage situated approximately midway between $V_S$ and GND at the output nodes $V_A$ and $V_B$ as explained in further detail below.

In the present embodiment, the upper leg A of a first output driver 425 of the H-bridge driver 401 comprises a pair of series or cascade coupled semiconductor switches such as CMOS transistors, preferably NMOS transistors. The series coupled semiconductor switches SW1 and SW2 are coupled to $V_S$ at a first end and the output node $V_A$ at an opposite end. The lower leg B of the first output driver 425 comprises another pair of series or cascade coupled CMOS semiconductor switches SW3 and SW4 coupled from the output node $V_A$ to GND. The upper leg C of the second output driver 426 of the H-bridge driver 401 comprises a pair of series or cascade coupled CMOS semiconductor switches SW5 and SW6 that preferably are identical in electrical characteristics to respective ones of the CMOS semiconductor switches SW1 and SW2 of leg A. The lower leg D comprises yet another pair of cascaded CMOS semiconductor switches SW7 and SW8 that preferably are identical in electrical characteristics to respective ones of the CMOS semiconductor switches SW3 and SW4 of leg B. The above-mentioned CMOS semiconductor switches are schematically illustrated on FIGS. 4a) and 4b) as ideal switch elements. Each of the semiconductor switches may be composed of a single semiconductor switch as schematically illustrated or may in other embodiments comprise a plurality of parallelly coupled individual semiconductor switches with common control terminals.

During operation of the H-bridge driver 401, the controller is configured to apply the first, second, third and fourth pulse width modulated control signals of appropriate amplitude to first, second, third and fourth gate terminals (not shown) of the CMOS semiconductor switches SW1, SW2, SW3 and SW4, respectively, so as to controlling respective states of these CMOS semiconductor switches. Thereby, the state of each of the CMOS semiconductor switches toggles or switches between an on-state or ON and an off-state or OFF in accordance with transitions of the pulse width modulated control signals. The same applies for CMOS semiconductor switches SW5, SW6, SW7 and SW8 of the second output driver 426 which are supplied with the $5^{th}$ $6^{th}$, $7^{th}$ and $8^{th}$ pulse width modulated control signals, respectively, at their gate terminals.

The on-resistance of each of the CMOS semiconductor switches SW1, SW2 in the on-state or conducting state or closed state may vary significantly according to requirements of a particular application, in particular an audio frequency impedance of the loudspeaker load 440. The on-resistance of semiconductor switches varies depending on switch dimensions, drive voltage at the control terminal, i.e. gate terminal in the present embodiment, and semiconductor process outcome. The semiconductor switches SW1, SW2 are preferably configured or designed to possess an on-resistance that is much smaller than an ohmic resistance of the loudspeaker load 440 such that power delivered through the output nodes $V_A$, $V_B$ predominantly is dissipated in the loudspeaker load 440 and to a smaller extent in the individual on-resistances of the semiconductor switches as switch power loss.

The on-resistance of each of the CMOS semiconductor switches SW1, SW2, SW3, SW4, SW5, SW6, SW7 and SW8 is preferably set to a value between 0.05 and 5 ohm such as between 0.1 and 0.5 ohm in the present embodiment of the invention.

A loudspeaker load 440 which may comprise a moving coil, moving armature or other type of audio speaker is operatively coupled in-between the first and second output nodes $V_A$ and $V_B$ of the H-bridge driver 400. The loudspeaker load 440 typically includes a resistive component in series with significant inductive component. A first load inductor 438 and a first load capacitor 422 is coupled between the first output node $V_A$ and a first terminal of the loudspeaker load 440 so as to form a lowpass filter. The first load inductor 438 and a first load capacitor 422 may be provided as external components to an integrated circuit implementation of the first and second output drivers 425, 426 of the H-bridge driver. The lowpass filtering suppresses modulation or switching frequency components of the output waveform present at the output nodes $V_A$, $V_B$ in the load signal applied across the loudspeaker load 440. In the present embodiment, the first load capacitor 422 may have a capacitance between 100 and 500 nF such as about 220 nF. The first load inductor 414 may have an inductance between 1 µH and 5 µH such as about 2.20 µH. The respective values of a second load inductor 437 and a second load capacitor 423 coupled to the second output node $V_B$ are preferably identical.

The first flying capacitor 418 has one terminal coupled to a first connection node 418a between the pair of cascade coupled CMOS semiconductor switches SW1, SW2 of the upper leg A of the first output driver 425 to provide electrical connection between SW1, SW2 and the flying capacitor terminal. An opposite terminal of the first flying capacitor 418 is coupled to a second connection node 418b situated between the pair of cascade coupled CMOS semiconductor switches SW3, SW4 of the lower leg B of the first output driver 425. The first flying capacitor 418 is precharged to a predetermined DC voltage which equals about one-half of a DC voltage difference between $V_S$ and GND, i.e. simply one-half of $V_S$ because of the GND connection of the lower DC supply voltage, before operation of the present H-bridge driver 400 is commenced. The first flying capacitor 418 therefore acts as a DC voltage source which maintains or sets a DC voltage difference of one-half $V_S$ between the first and second connection nodes 418a, 418b.

The controller (illustrated as item 1103 of FIG. 11) is configured to provide the first and fourth pulse width modulated control signals in opposite phase and non-overlapping such that CMOS semiconductor switches SW1 and SW2 are never simultaneously in on-states with zero modulation of the pulse width modulated control signals, i.e. the audio signal input is zero. Likewise, the second and third pulse width modulated control signals preferably have opposite phase and are non-overlapping at zero modulation of the pulse width modulated control signals such that CMOS semiconductor switches SW2 and SW3 are never in on-states or ON simultaneously at zero modulation. This means that the first flying capacitor 418 in a first state is coupled between $V_S$ and output node $V_A$ when SW1 and SW3 are simultaneously in on-states or ON while SW4 and SW2 are both OFF or in off-states leading to an output level of $V_S$ minus one-half of $V_S$, i.e. an output level of one-half of $V_S$. In a second state of the first output driver 425 the first flying capacitor 418 is coupled between GND and the output node $V_A$ through SW2 and SW4 when these are simultaneously ON while SW1 and SW3 are both OFF leading to an output level of GND plus one-half of the DC supply voltage, i.e. one-half $V_S$ as was the case in the first state. Accordingly, the first flying capacitor is operative to generate a third supply voltage level at the output node $V_A$ equaling one-half of the DC supply voltage $V_S$ in the present embodiment. This third supply voltage level is generated in both the first and the second output driver state as outlined above because of the chosen adaptation of the DC voltage of the first flying capacitor 418 to one-half $V_S$. Accordingly, the output levels at the output node $V_A$ of the first driver 425 therefore toggles between three discrete levels: $V_S$, one-half $V_S$ and GND. Naturally, the GND voltage may in other embodiments be a negative or positive DC supply voltage for example a negative DC voltage substantially equal in magnitude to the first DC supply voltage.

The illustrated H-bridge output driver 401 comprises a second output driver 426 coupled to another side or terminal of the loudspeaker load 403 through the second output node $V_B$. The circuit topology and electrical characteristics of the individual components such as CMOS semiconductor switches SW5, SW6, SW7, SW8 and the flying capacitor 419 of the second output driver 426 are preferably substantially identical to those of the corresponding components of the first output driver 425. Likewise, the external second load inductor 437 and the external second load capacitor 423 are preferably identical to the corresponding external components associated with the first output driver 425.

In a first embodiment of the invention, the various pulse width modulated control signals are configured such that the first and fifth fourth pulse width modulated control signals are in opposite phase at zero modulation. The same applies for the second and $6^{th}$ pulse width modulated control signals, the third and $7^{th}$ pulse width modulated control signals and the fourth and $8^{th}$ pulse width modulated control signals. This configuration of the pulse width modulated control signals ensures, in combination with the respective settings of the predetermined DC voltages of the flying capacitors $C_{fly1}$, $C_{fly2}$ (418, 419) to about one-half of the first DC supply voltage $V_S$, that a 3-level pulse width modulated output signal is generated between the first and second output nodes $V_A$ and $V_B$ and therefore applied as a load signal to the loudspeaker load 440. This 3-level pulse width modulated output signal is illustrated on FIG. 5 as waveform 507. As illustrated the present 3-level pulse width modulated output signal, which is applied to the loudspeaker 440 as a corresponding load signal, shares an advantageous property with the previously outlined prior art class BD modulation in that state switching rates at the first and second output nodes $V_A$ and $V_B$ are reduced when the audio signal input is close to zero.

In a second embodiment of the invention, the various pulse width modulated control signals are configured such that the first and fifth fourth pulse width modulated control signals are inverted and additionally phase shifted with +/−90 degrees relative to each other. The same applies for a corresponding phase relationship between the second and $6^{th}$ pulse width modulated control signals, the third and $7^{th}$ pulse width modulated control signals and the fourth and $8^{th}$ pulse width modulated control signals. This adaptation of the pulse width modulated control signals ensures, in combination with the setting of both of the predetermined DC voltages of the flying capacitors $C_{fly1}$, $C_{fly2}$ (418, 419) to about one-half of the first DC supply voltage $V_S$, that a 5-level pulse width modulated output signal is generated between the first and second output nodes $V_A$ and $V_B$ and therefore applied as a load signal to the loudspeaker load 440. This 5-level pulse width modulated output signal is illustrated on FIG. 5 as output waveform 513 depicting 2 discrete levels of pulse width modulated waveforms above zero, a zero level and 2 discrete levels of pulse width modulated waveforms below zero. As illustrated the present 5-level pulse width modulated output signal shares an advantageous property with the previously outlined class BD modulation and 3-level modulation in that state switching rates at the first and second output nodes $V_A$ and $V_B$ are reduced when the audio signal input is close to zero.

Figure 6:
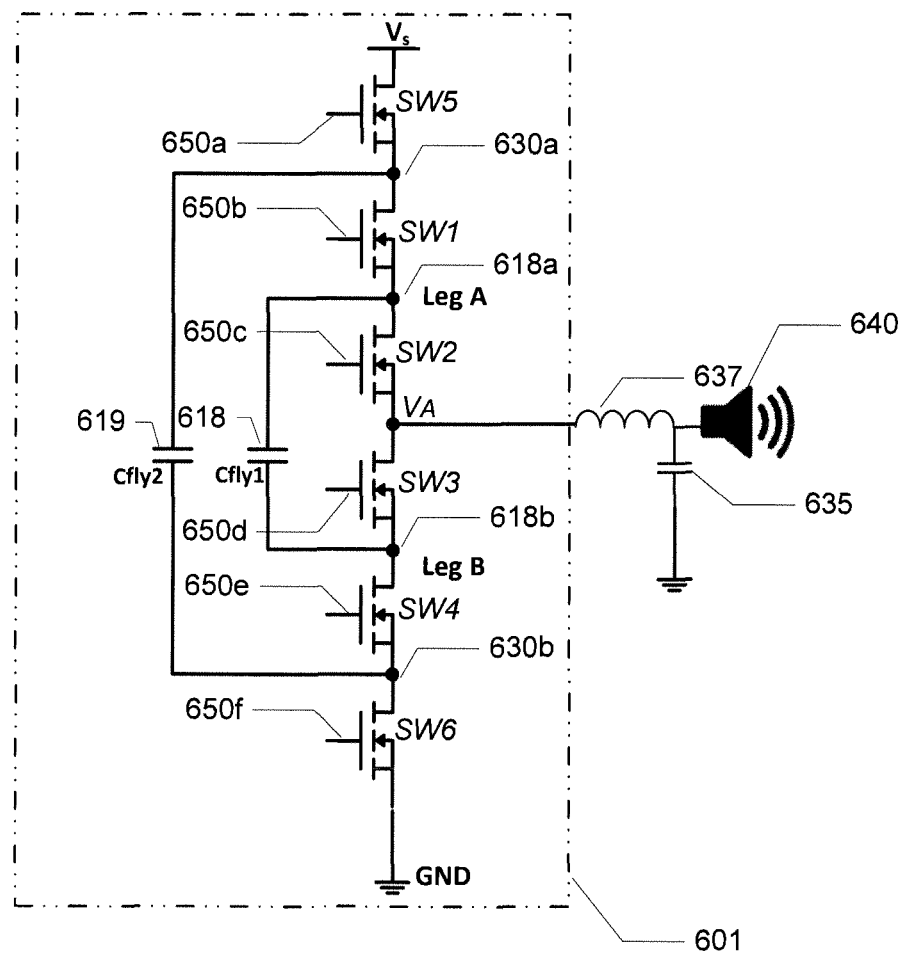
FIG. 6 is schematic diagram of a CMOS based single-ended multi-level output driver for class D audio amplifiers coupled to a loudspeaker load in accordance with a second embodiment of the invention.

FIG. 6 illustrates a CMOS based single-ended multi-level output driver 601 coupled to a loudspeaker load 640 through a lowpass filter comprising load inductor 637 and load capacitor 635 in accordance with a third embodiment of the invention. The single-ended multi-level output driver 601 comprises, in addition to semiconductor switches SW1, SW2, SW3, SW4 of the single-ended output driver depicted on FIG. 4a), a $5^{th}$ CMOS semiconductor switch SW5 and a sixth semiconductor switch SW6 to bring the total number of series coupled or connected CMOS semiconductor switches up to six. The $5^{th}$ CMOS semiconductor switch SW5 is coupled in series with the upper or first DC supply voltage $V_S$ and in series to the first and second semiconductor switches SW1 and SW2 which are coupled to an output node $V_A$. The $6^{th}$ CMOS semiconductor switch SW6 is coupled in series between GND and series coupled third and fourth semiconductor switches SW3 and SW4 which are coupled to the output node $V_A$. Consequently, both an upper leg A and a lower leg B of the present single-ended multi-level output driver 601 comprises three cascaded CMOS semiconductor switches instead of two switches as used in the output driver of FIG. 4a). Furthermore, the CMOS single-ended multi-level output driver 601 comprises a second flying capacitor $C_{fly2}$ 619 in addition to a first flying capacitor $C_{fly1}$ capacitor 618. The latter corresponds to the first flying capacitor 418 of the single-ended output driver depicted on FIG. 4b). The second flying capacitor 619 has one terminal coupled to a first connection node 630a situated between the pair of cascade coupled CMOS semiconductor switches SW5 and SW1 of the upper leg A. An opposite terminal of the second flying capacitor 619 is electrically coupled to a second connection node 630b situated between the pair of cascade coupled CMOS semiconductor switches SW4 and SW6 of the lower leg B. The second flying capacitor 619 is preferably pre-charged to a first predetermined DC voltage which may equal a DC voltage of between 60% and 75% of the DC supply voltage $V_S$ such as approximately two-thirds of the DC supply voltage. The first flying capacitor $C_{fly1}$ 618 is electrically coupled in-between third and fourth connection or coupling nodes situated between SW1 and SW2 and SW3 and SW4, respectively. The first flying capacitor 619 is preferably pre-charged to a second predetermined DC voltage which is different from the first predetermined DC voltage. The second predetermined DC voltage may lie between 25% and 40% of the DC supply voltage $V_S$ such as about one-third of the DC supply voltage $V_S$.

Consequently, the CMOS single-ended multi-level output driver 601 is capable of providing additional output levels at the output node $V_A$ compared to the 3-level or 4-level single-ended output driver topology depicted on FIG. 4a) depending on the chosen settings of the first and second predetermined DC voltages of the flying capacitors 618, 619.

The CMOS semiconductor switches SW1, SW2, SW3, SW4, SW5 and SW6 comprises respective switch control terminals or inputs in form of gate terminals 650a-f that are driven by appropriate pulse width modulated control signals supplied by an appropriately configured controller (not shown) of a class D audio amplifier.

The skilled person will understand that the single-ended multi-level output driver 601 could be modified to provide an H-bridge output driver topology based on a combination of two essentially identical output drivers 601 in a layout or circuit arrangement similar to that of the H-bridge output driver 401 depicted on FIG. 4b). This latter output driver toplogy is capable of providing a seven-level load signal across the loudspeaker load by generation of a first set of appropriately modulated control signals for the CMOS semiconductor switches SW1, SW2, SW3, SW4, SW5 and SW6 and generation of a second set of appropriately modulated control signals for corresponding CMOS semiconductor switches of the second output driver. Finally, the skilled person will understand that the CMOS single-ended multi-level output driver 601 could be further expanded by coupling one or more pair(s) of additional CMOS semiconductor switches in series with SW5 and SW6 and add additional flying capacitors between new interconnection nodes to create additional output levels at the output node $V_A$.

Figure 7:
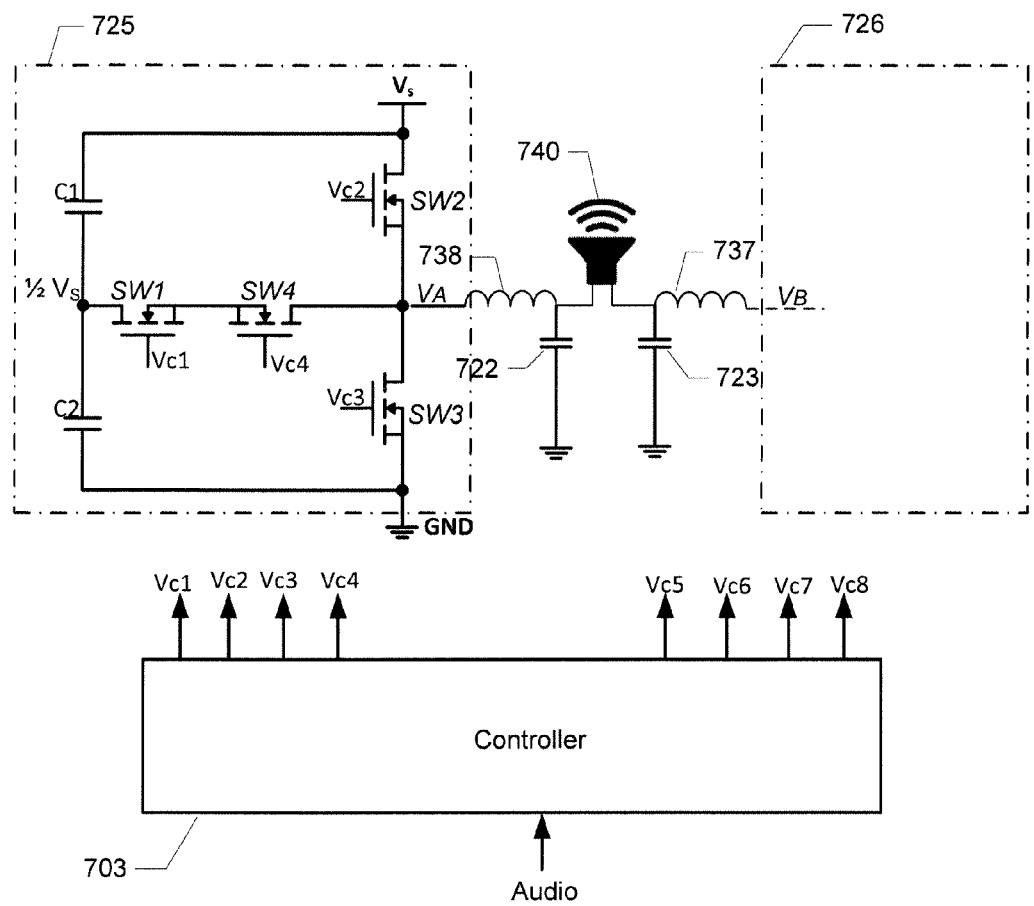
FIG. 7 is a schematic diagram of a class D audio amplifier with an H-bridge output driver coupled to a loudspeaker load in accordance with a third embodiment of the invention.

FIG. 7 is a schematic diagram of a class D audio amplifier with an H-bridge output driver comprising first and second output drivers 725, 726, respectively, coupled to a loudspeaker load 740 in accordance with a third embodiment of the invention. The topology is of each of the output drivers 725, 726 is often referred to as "neutral-point clamped" three-level half-bridge. A first load inductor 738 and a first load capacitor 722 is coupled between a first output node $V_A$ of the first driver 725 and a first terminal of the loudspeaker load 740 to form a lowpass filter. Another lowpass filter is formed by a second load inductor 737 and a second load capacitor 723 which are coupled between a second output node $V_B$ of the second driver 726 and a second terminal of the loudspeaker load 740. The purpose and characteristics of each of these lowpass filters are the same as those previously discussed in connection with the first embodiment of output driver 401.

The first output driver 725 comprises a first semiconductor switch SW2 coupled in series between a first supply voltage $V_S$ and a first output node $V_A$ of the first output driver. A second semiconductor switch SW3 is coupled in series between GND, i.e. a second supply voltage, and $V_A$. A third and fourth semiconductor switch SW1 and SW4, respectively, are coupled in series between a mid-point voltage ½ $V_S$ and $V_A$. The mid-point voltage ½ $V_S$ is generated by third supply voltage source as a third supply voltage for the first and, optionally second, output driver 725, 726. The third supply voltage source comprises a pair of supply capacitors, C1 and C2, coupled in series between the first supply voltage $V_S$ and GND voltage to provide the mid-point voltage. The supply capacitors, C1 and C2 preferably have substantially equal capacitance such that the mid-point voltage is set to approximately one-half of the first supply voltage $V_s$. Each of the semiconductor switches, SW1, SW2, SW3 and SW4 comprises a gate terminal Gc1, Gc2, Gc3 and Gc4 to control the state of the semiconductor switch in question. The semiconductor switches, SW1, SW2, SW3 and SW4 may comprise respective CMOS transistors such as NMOS transistors.

The second output driver 726 comprises the second output node $V_B$ which is coupled to an opposite side or terminal of the loudspeaker load 740. The second output driver 726 comprises semiconductor switches SW5, SW6, SW7 and SW8 coupled in a circuit topology similar to that of the first output driver 725. The second output driver 726 may comprise a separate third supply voltage source, preferably similar to the third supply voltage source of the first output driver, to generate a mid-point voltage. Alternatively, the mid-point voltage generated for the first output driver 725 may be utilized by the second output driver as well. The circuit topology of the second output driver 726 and electrical characteristics of its individual components are preferably substantially identical to those of the first output driver 725.

Figure 9:
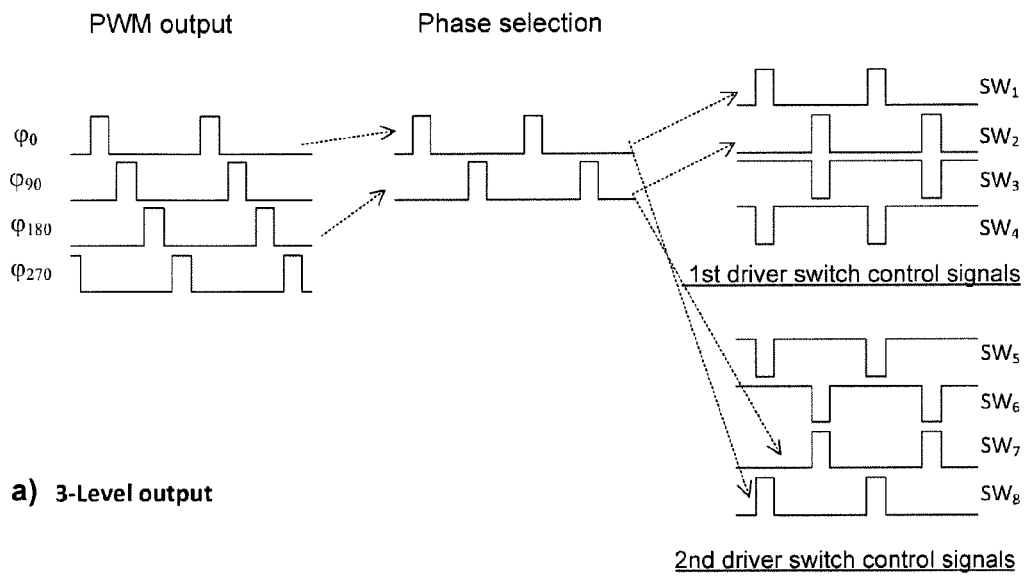
Figure 9:
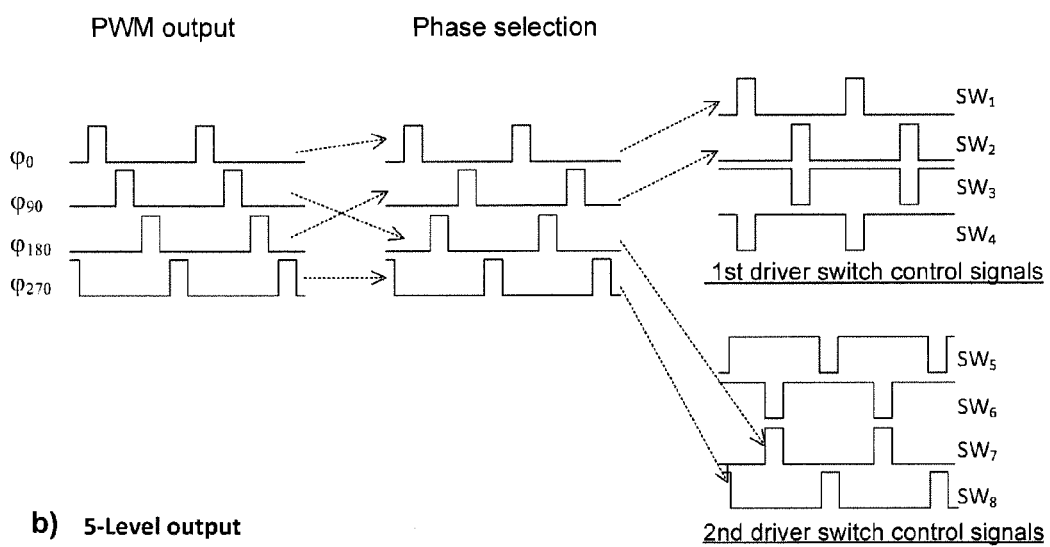

A controller 703 is configured to receive an audio input signal, Audio, and derive a first set of pulse width modulated control signals and a second set of pulse width modulated control signals therefrom. The first set of pulse width modulated control signals are illustrated by Vc1, Vc2, Vc3 and Vc4 which are applied to the gate terminals of CMOS semiconductor switches SW1, SW2, SW3 and SW4, respectively. The second set of pulse width modulated control signals are illustrated by Vc5, Vc6, Vc7 and Vc8 which are applied to CMOS semiconductor switches SW5, SW6, SW7 and SW8, respectively, arranged inside the second output driver 726. The controller is configured to control a predetermined phase relationship between the first set of pulse width modulated control signals and the second set of pulse width modulated control signals such that a three-level load signal is generated across the loudspeaker load 740 in a first operation mode and a five-level load signal generated across the loudspeaker load 740 in a second operation mode. An exemplary illustration of the process for the generation of the first and second sets of pulse width modulated control signals is explained in additional detail below in connection with FIG. 9.

Figure 8:
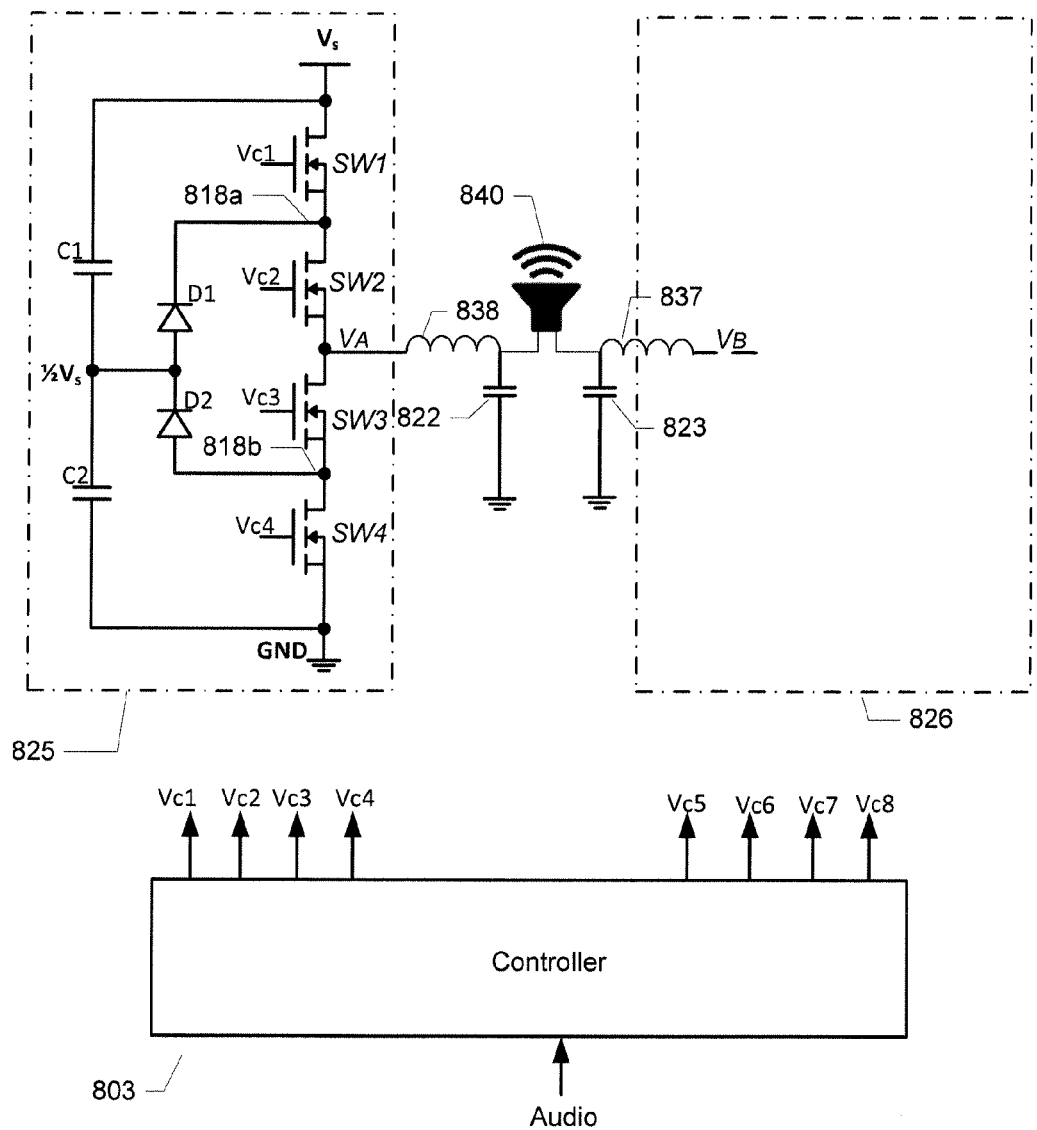
FIG. 8 is a schematic diagram of a class D audio amplifier with an H-bridge output driver coupled to a loudspeaker load in accordance with a fourth embodiment of the invention, FIGS. 9a) and 9b) illustrate the generation of pulse width modulated control signals for each of the semiconductor switches of the H-bridge output driver depicted on FIG. 4b) in a three-level operational mode and a five-level operational mode, FIGS. 10a) and 10b) show load capacitor ripple voltage and load inductor ripple current, respectively, versus modulation duty cycle for the prior art H-bridge driver illustrated on FIG. 1 in comparison with the H-bridge driver depicted on FIG. 4b) operating in three-level output mode.

FIG. 8 is a schematic diagram of a class D audio amplifier with an H-bridge output driver comprising first and second output drivers 825, 826, respectively, coupled to a loudspeaker load 840 in accordance with a fourth embodiment of the invention. A first load inductor 838 and a first load capacitor 822 is coupled between a first output node $V_A$ of the first driver 825 and a first terminal of the loudspeaker load 840 to form a lowpass filter. Another lowpass filter is formed by a second load inductor 837 and a second load capacitor 823 which are coupled between a second output node $V_B$ of the second driver 826 and a second terminal of the loudspeaker load 840. The purpose and characteristics of each of these lowpass filters are the same as those previously discussed in connection with the first embodiment of output driver 401. The first output driver 825 comprises a first and second series coupled semiconductor switches SW1, SW2 coupled in-between a first supply voltage $V_S$ and the first output node $V_A$. Third and fourth semiconductor switches SW3, SW4 are coupled in series between GND, i.e. a second supply voltage, and $V_A$. A first semiconductor diode D1 is coupled from a mid-point voltage ½ $V_S$ to a first node 818a, located between SW1 and SW2. A second semiconductor diode D2 is coupled from the mid-point voltage ½ $V_S$ to a second node 818b, located between SW3 and SW4. The mid-point voltage ½ $V_S$ is generated by third supply voltage source for the first and, optionally second, output driver 825, 826. The third supply voltage source comprises a pair of supply capacitors, C1 and C2, coupled in series between the first supply voltage $V_S$ and GND voltage to provide the mid-point voltage. The supply capacitors, C1 and C2 preferably have substantially equal capacitance such that the mid-point voltage is set to approximately one-half of the first supply voltage $V_S$. Each of the semiconductor switches, SW1, SW2, SW3 and SW4 comprises a gate terminal Gc1, Gc2, Gc3 and Gc4, respectively, to control the setting of the state (i.e. on-state or off-state) of the semiconductor switch in question. The second output driver 826 comprises the second output node $V_B$ which is coupled to an opposite side or terminal of the loudspeaker load 840. The second output driver 826 comprises CMOS semiconductor switches SW5, SW6, SW7 and SW8 coupled in a circuit topology similar to that of the first output driver 825. The second output driver 826 may comprise a separate third supply voltage source, preferably similar to the third supply voltage source of the first output driver, to generate a separate mid-point voltage. Alternatively, the mid-point voltage generated for the first output driver 825 may be utilized by the second output driver as well. The circuit topology of the second output driver 826 and electrical characteristics of its individual components are preferably substantially identical to those of the first output driver 825.

A controller 803 is configured to receive an audio input signal, Audio, and derive a first set of pulse width modulated control signals and a second set of pulse width modulated control signals therefrom. The first set of pulse width modulated control signals are illustrated by Vc1, Vc2, Vc3 and Vc4 which are applied to gate terminals of the CMOS semiconductor switches SW1, SW2, SW3 and SW4, respectively. The second set of pulse width modulated control signals are illustrated by Vc5, Vc6, Vc7 and Vc8 which are applied to the CMOS semiconductor switches SW5, SW6, SW7 and SW8 (not shown), respectively, arranged inside the second output driver 826. The output voltage at the first output node $V_A$ can be set to approximately the mid-point voltage ½ $V_S$ when SW2 and SW3 are set to their respective on-states. When SW2 and SW3 simultaneously are in their on-states, a bi-directional current path is formed between the mid-point voltage and $V_A$ since D1 will conduct current in one direction and D2 conduct current in the opposite direction. Consequently, the voltage at the first output node $V_A$ can be set to three different levels to provide the desired three-level load signal. The skilled person will understand the output voltage at the second output node $V_B$ can be set to three different levels in a corresponding manner.

The controller 803 is configured to control a predetermined phase relationship between the first set of pulse width modulated control signals and the second set of pulse width modulated control signals such that a three-level load signal is generated across the loudspeaker load 840 in a first operation mode and a five-level load signal generated across the loudspeaker load 840 in a second operation mode. An exemplary illustration of the process for the generation of the first and second sets of pulse width modulated control signals is explained in additional detail below in connection with FIG. 9.

Figure 11:
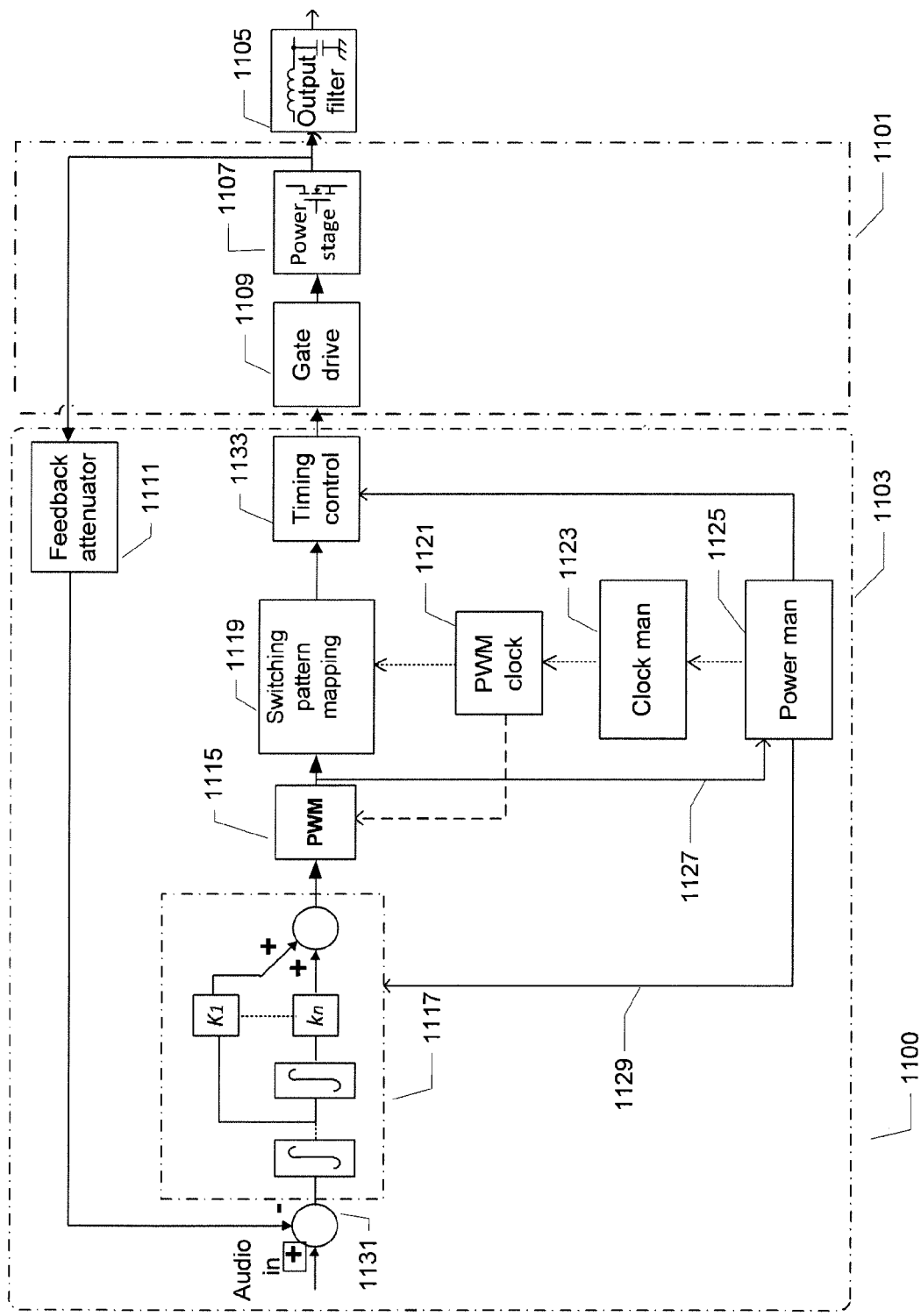
FIG. 11 illustrates schematically a class D audio amplifier comprising the H-bridge driver depicted on FIG. 4b) and an accompanying controller.

FIGS. 9a) and 9b) illustrate the generation of pulse width modulated control signals for each of the semiconductor switches of the H-bridge output driver 401 depicted on FIG. 4b). The pulse width modulated control signals SW$_1$-SW$_8$ are derived by a switching pattern mapping circuit (1119 of FIG. 11) of the controller 1103 depicted on FIG. 11 from an audio input signal. The illustrated waveform shapes of the pulse width modulated control signals SW$_1$-SW$_8$ of FIGS. 9a) and 9b) are mapped for predetermined non-zero instantaneous level of the audio input signal, i.e. with modulation. FIG. 9a) illustrates the generation of pulse width modulated control signals in the three-level operation mode of the class D audio amplifier 1100 of FIG. 11 while FIG. 9b) illustrates the generation of pulse width modulated control signals in the five-level operation mode. In both operation modes, the analog PWM 1115 depicted on FIG. 11 is configured to derive four pulse width modulated signals $\phi_0$, $\phi_{90}$, $\phi_{180}$ and $\phi_{270}$ successively phase-shifted 90 degrees from each other and convey these to the switching pattern mapping circuit.

In the three-level operation mode depicted on FIG. 9a), the switching pattern mapping circuit performs a phase selection by selecting pulse width modulated signals $\phi_0$ and $\phi_{180}$ as the pulse width modulated control signals SW$_1$ and SW$_2$ for semiconductor switches SW1 and SW2 of the first output driver (item 425 of FIG. 4b). The switching pattern mapping circuit furthermore generates a pair of pulse width modulated control signals SW$_3$ and SW$_4$ that are in opposite phase, or inverted, relative to SW$_2$ and SW$_1$, respectively, as the pulse width modulated control signals for semiconductor switches SW3 and SW4 of the first output driver. From the selected pulse width modulated signals $\phi_0$ and $\phi_{180}$ the switching pattern mapping circuit furthermore generates pulse width modulated control signals SW$_8$ and SW$_7$ for semiconductor switches SW8 and SW7 of the second output driver (item 426 of FIG. 4b). The switching pattern mapping circuit furthermore generates a pair of pulse width modulated control signals SW$_5$ and SW$_6$ that are in opposite phase to SW$_8$ and SW$_7$, respectively, as the pulse width modulated control signals for the semiconductor switches SW8 and SW7 of the second output driver. Consequently, in the three-level operation mode the switching pattern mapping circuit is configured to generate a first set of modulated control signals in form of the pulse width modulated control signals SW$_1$, SW$_2$, SW$_3$ and SW$_4$ for the first output driver that are in opposite phase, or inverted, relative to corresponding pulse width modulated control signals of a second set of pulse width modulated control signals SW$_5$, SW$_6$, SW$_7$ and SW$_8$ for the second output driver. In this manner the pulse width modulated control signals SW$_1$ for the first output driver is rendered in opposite phase to the corresponding pulse width modulated control signal SW$_5$ for the second output driver, SW$_2$ for the first output driver rendered in opposite phase to the corresponding pulse width modulated control signal $SW_6$ for the second output driver and so on.

In the five-level operation mode depicted on FIG. 9b), the switching pattern mapping circuit performs a phase selection by selecting and re-arranging all pulse width modulated signals $\phi_0$, $\phi_{90}$, $\phi_{180}$ and $\phi_{270}$ as illustrated before generating the first set of modulated control signals in form of the pulse width modulated control signals $SW_1$, $SW_2$, $SW_3$ and $SW_4$ for the first output driver. By comparison with FIG. 9a), it is evident that the respective waveforms of the pulse width modulated control signals $SW_1$, $SW_2$, $SW_3$ and $SW_4$ of the first output driver are identical in the three-level and five-level operation modes. However, the waveforms of the second set of control signals in form of the pulse width modulated control signals $SW_5$, $SW_6$, $SW_7$ and $SW_8$ of the second output driver differ between the three-level and five-level operation modes as illustrated. The switching pattern mapping circuit is configured to generate pulse width modulated control signals in the second set of pulse width modulated control signals $SW_5$, $SW_6$, $SW_7$ and $SW_8$ for the second output driver that are inverted and additionally phase shifted with minus 90 degrees relative to the corresponding pulse width modulated control signals of the first set of pulse width modulated control signals $SW_1$, $SW_2$, $SW_3$ and $SW_4$ for the first output driver. In this manner the pulse width modulated control signal $SW_5$ for the second output driver is rendered inverted and with an additional minus 90 degrees phase shift relative to the corresponding pulse width modulated control signal $SW_1$ for the first output driver, $SW_6$ for the second output driver rendered inverted and additionally phase shifted minus 90 degrees relative to the corresponding pulse width modulated control signal $SW_2$ for the first output driver and so on.

Figure 10:
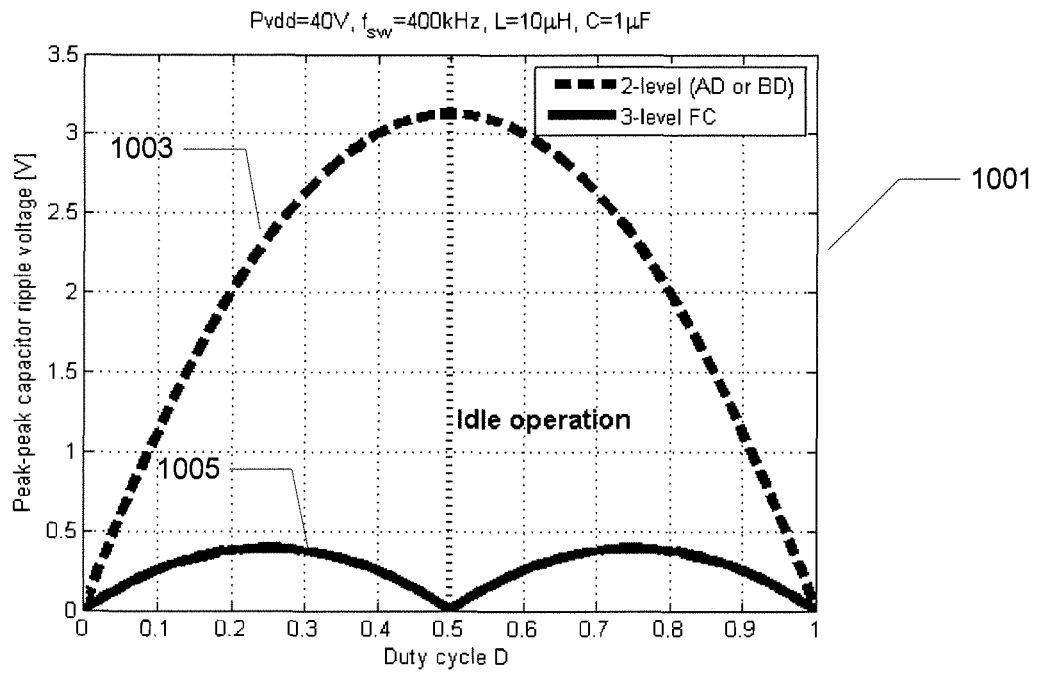
Figure 10:
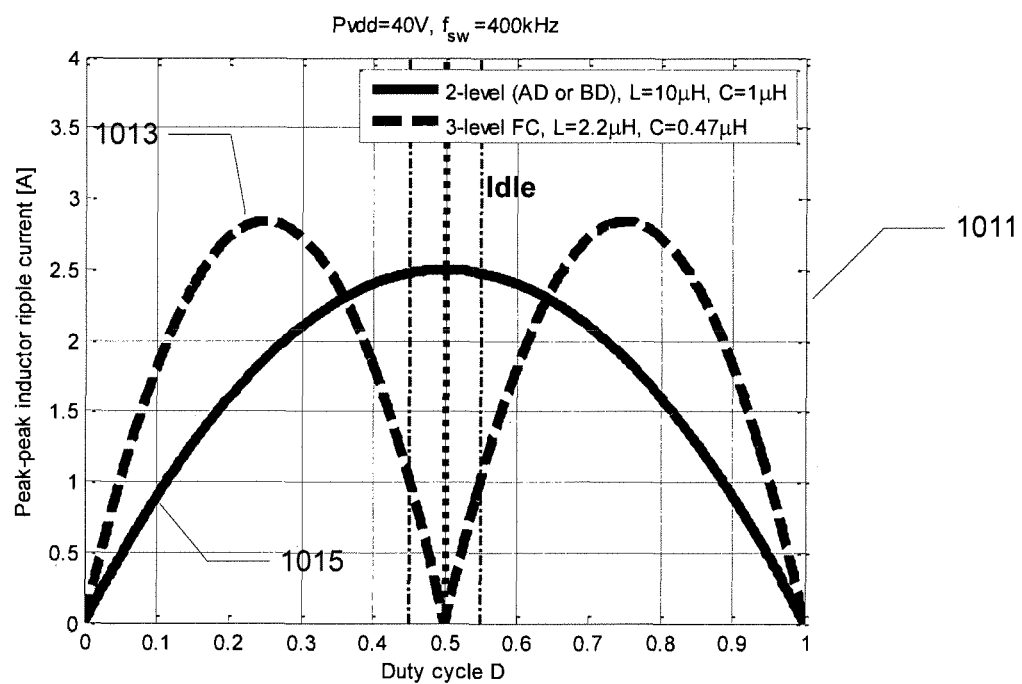

FIGS. 10a) and 10b) are respective graphs of load capacitor ripple voltage and load inductor ripple current, respectively, plotted versus modulation duty cycle of the pulse width modulated switch control signals. A modulation duty cycle of 0.5 corresponds to zero modulation of the pulse width modulated audio signal which in turn corresponds to zero level of the audio input signal as indicated on the graph 1001 by the marking "Idle operation". The depicted graphs have been plotted for a load inductor value of 10 μH (refer to FIG. 4b) item 438) and a load capacitor value of 1 μF (refer to FIG. 4b) item 422). The first or upper DC supply voltage $V_S$ or $P_{VDD}$ of the H-bridge output driver 401 was set to 40 Volt. The switching or modulation frequency of each of the pulse width modulated switch controls signals was set to 400 kHz.

The graph 1001 of FIG. 10a) displays the load capacitor ripple voltage measured in Volts peak-to-peak on the load capacitor (item 422 of FIG. 4b)) for two different types of class D audio amplifiers. Curve 1003 shows capacitor ripple voltage for the prior art output drivers utilizing 2-level class AD or BD modulation as displayed on FIGS. 1, 2 and 3. The curve 1005 shows capacitor ripple voltage for the 3-level operation mode of the H-bridge output driver 401 of FIG. 4b) in accordance with the first aspect of the present invention. A large reduction of the peak-to-peak capacitor ripple voltage, in particular around zero modulation, is evident. This decrease of capacitor ripple voltage leads to a very advantageous suppression or attenuation of EMI emissions from class D amplifier based on the present H-bridge output driver 401 even when identical capacitance values of the load capacitors are used.

Graph 1011 of FIG. 10b) displays the load inductor ripple current in the load inductor (item 438 of FIG. 4b)) measured in Amperes peak-to-peak for two different types of class D audio amplifiers. The curve 1013 shows load inductor ripple current for the prior art 2-level class AD or BD modulation output drivers displayed on FIGS. 1, 2 and 3 measured with a load inductor value of 10 μH and load capacitor value of 1 μF. The curve 1015 shows load inductor ripple current for the 3-level operation mode of the H-bridge output driver 401 of FIG. 4b). However, in the latter case, the load inductor value is only 2.2 μH (compared to 10 μH for the 2-level class AD or BD modulation output drivers) and the load capacitor value is 0.47 μF. A very large reduction of amplitude of the inductor ripple current is achieved around zero modulation, i.e. for small audio input signals that tend to dominate everyday listening situations, despite the significantly smaller values of load inductance and load capacitance for the present H-bridge output driver.

FIG. 11 illustrates schematically a class D audio amplifier 1100 comprising an H-bridge driver 1101 similar to the H-bridge output driver 401 depicted on FIG. 4b) coupled to a controller 1103 in accordance with a preferred embodiment of the invention. The present class D audio amplifier 1100 utilizes a sophisticated audio input signal level dependent switching between two different operational modes as explained in detail below.

The schematically illustrated H-bridge driver 1101 comprises a gate drive circuit 1109 that increases amplitudes of respective pulse width modulated control signals for the eight semiconductor switches of the power stage 1107 to a level that allows the individual semiconductor switches to be appropriately placed in ON and OFF states. The gate drive circuit 1109 may comprises various types of level converters. The amplitude of each of the pulse width modulated switch control signals may be around 1.8 Volt, 3.3 Volt or 5 Volt when supplied from a normal CMOS integrated circuit comprising the controller 1103. If the DC supply voltage of the H-bridge driver for example is set to about 40 Volts, the amplitudes of the pulse width modulated switch control signals are raised to about 40 Volts, or more, by the gate drive circuit 1109 as well. The power stage 1107 has a circuit topology largely identical to the H-bridge output driver 401 depicted on FIG. 4b) as mentioned before. The characteristics of the output filter circuit 1105 are preferably also similar to the output filter coupled to the H-bridge output driver 401. The output filter circuit 1105 accordingly comprises a load inductor and load capacitor coupled to each of a first and a second output node of the H-bridge output driver 1101.

The controller 1103 preferably comprises a software programmable Digital Signal Processor (DSP) configured to provide the below described functions or operations in accordance with a set of executable program instructions. The controller 1103 comprises a subtraction circuit 1131 for receipt of analog audio input signals. A feedback signal derived from the first or second output node of the H-bridge output driver prior to the output filter circuit 1105 is subtracted from the analog audio input signal by the subtraction circuit 1131 to form a resulting audio signal. The resulting audio signal is transmitted into the loop filter 1117. The loop filter 1117 comprises one or more integrators, schematically illustrated by integrator symbols and integrator coefficients $K_1$-$K_n$, that lowpass filters the resulting audio input signal before transmission to an analog pulse width modulator circuit 1115 or analog PWM. The carrier frequency of the analog PWM 1115 is controlled by a PWM clock circuit 1121 that generates synchronization pulses to the analog PWM 1115. The analog PWM 1115 produces a naturally sampled pulse width modulated audio signal with a carrier frequency set by the PWM clock circuit 1121. The naturally sampled pulse width modulated audio signal is conveyed to a switching pattern mapping circuit 1119. The switching pattern mapping circuit 1119 is configured to generate an appropriately phased and timed pulse width modulated control signal for each of the eight semiconductor switches of the power stage 1107 as previously explained in connection with FIGS. 9a) and 9b). In the present embodiment of the invention, the output of the switching pattern mapping circuit 1119 is therefore eight pulse width modulated control signals which are conveyed to an optional timing controller 1133. The timing controller 1133 may be adapted to perform certain time base adjustments to one or more of the eight pulse width modulated control signal for example dead-time control between certain pairs of control signals to ensure non-overlap of the same control signals. The eight time-base adjusted pulse width modulated control signals are thereafter transmitted to the gate drive 1109 as described above.

In one embodiment, the switching pattern mapping circuit 1119 comprises a sampling circuit embodied as a digital register that is operated by a clock signal, Clock, of the class D amplifier. The digital register regularly samples or latches a signal value of the naturally sampled pulse width modulated audio signal synchronously to the clock signal to provide a uniformly sampled pulse width modulated audio signal representative of the naturally sampled pulse width modulated audio signal. The sampling frequency at which the register is operated may be set to value between 10 MHz and 400 MHz such as between 50 MHz and 200 MHz for carrier frequencies of the naturally sampled pulse width modulated audio signal between 100 kHz and 1.2 MHz.

In other embodiments, the switching pattern mapping circuit 1119 operates entirely in the analog domain such that each of the respective pulse width modulated control signals for the eight semiconductor switches of the power stage 1107 is a naturally sampled pulse width modulated audio signal.

However, in both embodiments, the switching pattern mapping circuit 1119 is configured to generate pulse width modulated switch control signals with appropriate timing and polarity to the eight individual semiconductor switches of the H-bridge output driver 1107 as described above in connection with FIG. 4b) and FIGS. 9a) and 9b). The carrier frequency of each of the pulse width modulated control signals is set by the PWM clock generator 1121 operating in accordance with a clock frequency control signal set by the clock management circuit 1123. The clock management circuit 1123 is thereby adapted to control the carrier frequency of the PWM clock generator 1121. A power management circuit 1125 comprises a modulation sensing input port 1127 allowing the power management circuit 1125 to detect a modulation duty cycle of the pulse width modulated audio signal supplied to the input of the switching pattern mapping circuit 1119. Since the detected modulation duty cycle indicates an instantaneous level of the resulting audio input signal, the power management module exploits this audio level information to control the carrier frequency setting of the pulse width modulated control signals or switch control signals. Furthermore, the power management circuit or module 1125 is further adapted to exploit the audio level information to select between a 3-level modulation mode and 5-level modulation mode at the output nodes of the H-bridge output driver 1107. In the present embodiment, the power management circuit 1125 is configured to switch between three distinct operational modes depending on the detected modulation duty cycle. Lower and upper modulation thresholds determine both the appropriate settings of the carrier frequency and the appropriate setting of the operation mode (3-level mode or 5-level mode in the present embodiment) such that a first or super-idle mode is entered when the detected modulation duty cycle is below the lower modulation threshold. This first modulation threshold may for example be set to a modulation index between 0.01 and 0.05 such as about 0.02. In the super-idle mode, the carrier frequency $f_{sw}$ may be set to about 150 KHz and the switch control signals are preferably configured to provide 5-level modulation by the switching pattern mapping circuit 1119. This operational mode is graphically depicted as super-idle mode 1203 in FIG. 12 where the horizontal arrow indicates increasing direction of the level of the audio input signal and thus increasing modulation duty cycle.

The power management circuit 1125 is configured to switch to a second or low-power mode 1205 once the detected modulation duty cycle exceeds the lower modulation threshold but still lies below the upper modulation threshold. This second modulation threshold may for example be set to a modulation index between 0.05 and 0.2 such as about 0.1. In the low-power mode, the carrier frequency $f_{sw}$ is preferably increased relative to the super-idle mode because it allows a higher loop bandwidth of the feedback path so as to improve suppression of non-linarites in the H-bridge output driver of the power stage 1107. The carrier frequency $f_{sw}$ may be set to about twice the latter carrier frequency. The switch control signals are preferably configured to maintain the existing 5-level modulation to maximize the loop bandwidth of the feedback path for a given setting of the carrier frequency $f_{sw}$ of the naturally sampled pulse width modulated audio signal.

Finally, the power management circuit 1125 is configured to switch to a third or normal mode 1207 once the detected modulation duty cycle exceeds the upper modulation threshold. In the normal mode, the carrier frequency $f_{sw}$ is preferably increased by a predetermined amount relative to the carrier frequency of the low-power mode because of the change of operational mode in normal mode. This change would tend to reduce the loop bandwidth if the carrier frequency remained constant. However, the 3-level modulation of output signal across the loudspeaker load suppresses the common mode component of the load capacitor ripple voltage in an advantageous manner to improve EMI performance at large audio signal levels.

In certain embodiments, the power management circuit 1125 may be adapted to alter frequency response characteristics of the loop filter 1117 in an adaptive manner depending on the detected modulation duty cycle through a filter control signal 1129. This is particularly useful to maintain or change an existing loop filter bandwidth in response to a switch between the above-described super-idle mode, low-power mode and normal mode.

Figure 12:
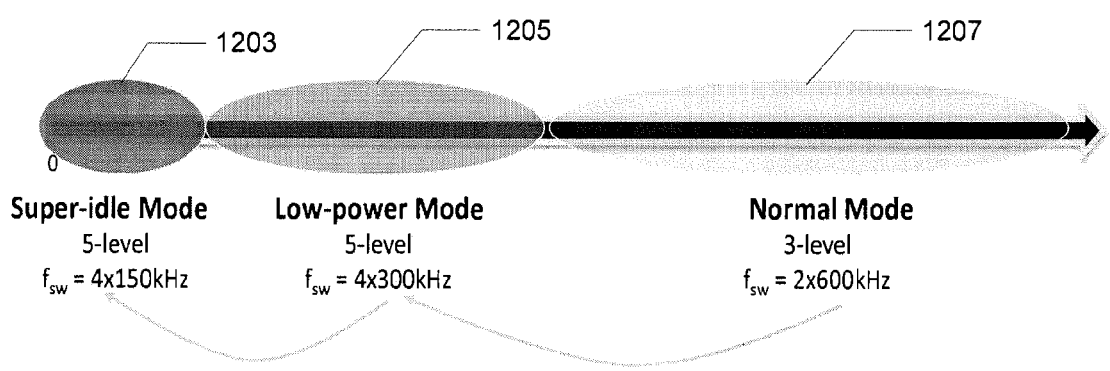
FIG. 12 illustrates a mode-switching scheme for operating the present class D amplifier embodiments in different operation modes dependent on a detected level of the audio input signal in accordance with a fifth embodiment of the invention.
Figure 13:
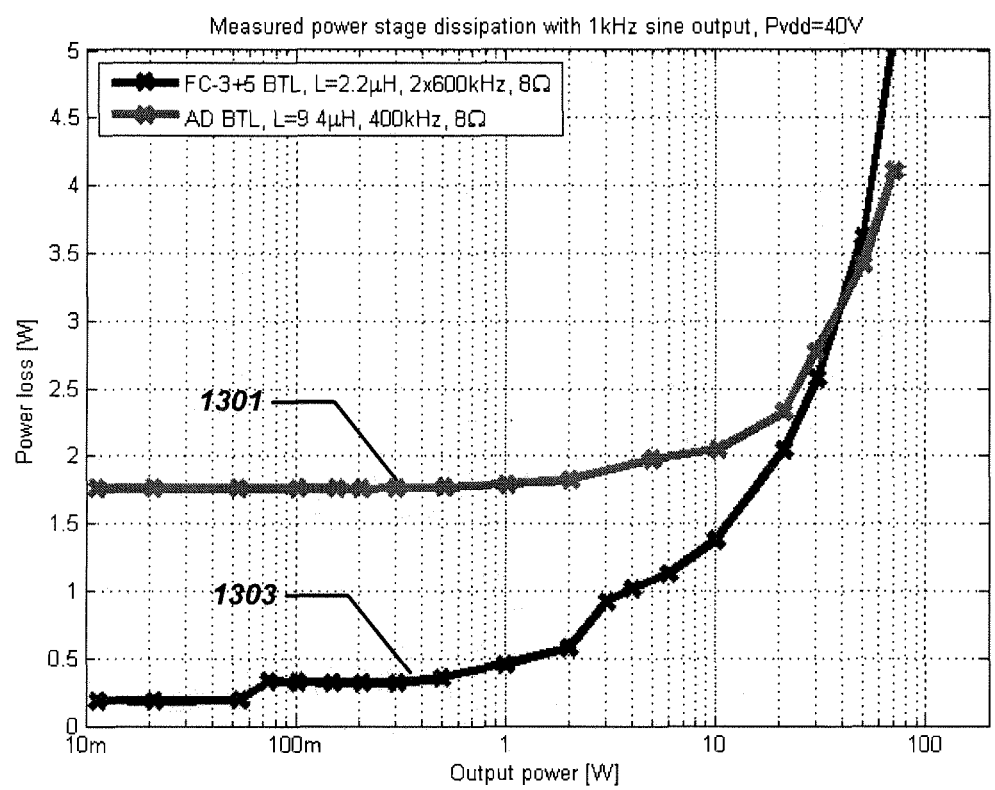
FIG. 13 illustrates experimentally recorded power loss data for a prior art H-bridge driver and the H-bridge output driver in accordance with the second embodiment of the invention depicted on FIG. 4b).

FIG. 13 illustrates experimentally recorded power dissipation data for the prior art H-bridge output driver depicted on FIG. 2 using AD modulation in comparison to the H-bridge output driver in accordance with present invention depicted on FIG. 4b) applying the modulation duty cycle dependent mode switching scheme disclosed above in connection with FIGS. 11 and 12. The audio input signal is a 1 kHz sine wave and the loudspeaker load is 8 ohm in both illustrated cases. The prior art H-bridge driver uses a load inductor value of 9.4 µH and a modulation frequency of 400 kHz. The H-bridge output driver in accordance with present invention uses a load inductor value of 2.2 µH and a modulation frequency of 600 kHz. Curve 1301 represents the measured power loss in Watts versus supplied load power or output power for the prior art H-bridge output driver while curve 1303 represents the same figure of merit for the H-bridge output driver in accordance with present invention. As illustrated, a considerable reduction of power loss is offered by the present invention throughout the majority of the linear operation range of the H-bridge output drivers. The marked reduction in power loss for small values of the delivered output power such as output powers less than 1 Watt, are particularly noticeable because this power range is used in many everyday listing situations. The measured power dissipation savings amount to a factor of about 9 (nine) for small values of the output or load power. It is also noticeable that this markedly improved energy efficiency is obtained without using larger load inductor or load capacitors values for the present H-bridge driver—on the contrary under the conditions for the experimentally recorded power loss data of FIG. 13 the load inductor is significantly smaller.

The invention claimed is:

1. A class D audio amplifier comprising:
   a first output driver comprising an output node connectable to a loudspeaker load to supply a load signal thereto,
   said first output driver comprising an upper leg coupled between a first DC supply voltage and the output node and a lower leg coupled between the output node and a second DC supply voltage,
   the upper leg comprising a first semiconductor switch and a second semiconductor switch coupled in series and controlled by first and second switch control terminals, respectively,
   the lower leg comprising a third semiconductor switch and a fourth semiconductor switch coupled in series and controlled by third and fourth switch control terminals, respectively;
   a controller adapted to receive an audio input signal and derive first, second, third and fourth pulse width or pulse density modulated control signals therefrom,
   the controller being configured to apply the first, second, third and fourth pulse width or pulse density modulated control signals to the first, second, third and fourth switch control terminals, respectively, the first, second, third and fourth pulse width modulated control signals being configured to, in a first state, connect a first terminal of the DC voltage source to the output node through the first and third semiconductor switches, and in a second state, connect a second terminal of the DC voltage source to the output node through the fourth and second semiconductor switches; and
   a first DC voltage source configured to set a first predetermined DC voltage difference between a first node, located between the first and second semiconductor switches, and a second node, located between the third and fourth semiconductor switches.

2. The class D audio amplifier according to claim 1, wherein the first predetermined DC voltage difference is set substantially to one half of a DC voltage difference between the first and second DC supply voltages to provide a 3-level output signal at the output node.

3. The class D audio amplifier according to claim 1, wherein the controller further comprises:
   an analog pulse width modulator coupled to receive an analog audio input signal and generate a naturally sampled pulse width modulated audio signal,
   a sampling device operating in accordance with a digital clock signal and adapted to generating a uniformly sampled pulse width or pulse density modulated audio signal based on the naturally sampled pulse width modulated audio signal,
   the controller generating the first, second, third and fourth pulse width or pulse density modulated control signals based on the uniformly sampled pulse width or pulse density modulated audio signal.

4. The class D audio amplifier according to claim 3, comprising a feedback loop comprising a feedback path extending from the load signal to a summing node positioned in front of the analog pulse width modulator,
   a loop filter such as a first, second or third order low pass filter, inserted in the feedback loop to shape a spectrum of quantization noise generated by sampling of the naturally sampled pulse width modulated audio signal.

5. The class D audio amplifier according to claim 1, wherein the controller further comprises:
   a PCM to PWM converter coupled to receive a digital audio input signal and generate a quantized uniformly sampled pulse width modulated audio signal,
   a noise shaper filtering the quantized uniformly sampled pulse width modulated audio signal to suppress quantization noise therein,
   a switch controller generating the first, second, third and fourth pulse width modulated control signals based on the quantized uniformly pulse width modulated audio signal.

6. The class D audio amplifier according to claim 5, wherein the switch controller is adapted to perform redundant state selection balancing to maintain the first predetermined DC voltage difference between the first and seconds nodes of the first output driver.

7. The class D audio amplifier according to claim 1, further comprising:
   a second output driver comprising a second output node connectable to the loudspeaker load to supply a second load signal there to,
   said second output driver comprising an upper leg coupled between the first DC supply voltage and the second output node and a lower leg coupled between the second output node and the second DC supply voltage,
   the upper leg of said second output driver comprising a fifth semiconductor switch and a sixth semiconductor switch coupled in series and controlled by fifth and sixth switch control terminals, respectively,
   the lower leg of said second output driver comprising a 7th semiconductor switch and a 8th semiconductor switch coupled in series and controlled by 7th and 8th switch control terminals, respectively;
   a second DC voltage source configured to set a second predetermined DC voltage difference between a third node, situated between the fifth and sixth semiconductor switches, and a fourth node, situated between the 7th and 8th semiconductor switches;
   wherein the controller is adapted to derive fifth, sixth, 7th and 8th pulse width modulated control signals from the audio input signal and apply these to the fifth, sixth, 7th and 8th switch control terminals, respectively.

8. The class D audio amplifier according to claim 7, wherein the controller is adapted to generate the fifth, sixth, 7th and 8th pulse width modulated control signals in substantially opposite phase to a phase of the first, second, third and fourth pulse width modulated control signals, respectively, to generate a 3-level load signal across the loudspeaker load.

9. The class D audio amplifier according to claim 7, wherein the controller is adapted to generate the fifth, sixth, 7th and 8th pulse width modulated control signals with opposite phase and an additional +/−90 degrees phase shift relative to the first, second, third and fourth pulse width modulated control signals, respectively, to generate a 5-level load signal across the loudspeaker load.

10. The class D audio amplifier according to claim 8, wherein the controller comprises an audio signal level detector,
the controller being adapted to switch between the 3-level load signal and the 5-level load signal in dependence of a detected level of the audio input signal.

11. The class D audio amplifier according to claim 10, wherein the controller is further adapted to:
comparing the detected level of the audio input signal with a predetermined level threshold,
generate the 3-level load signal when the audio signal level exceeds the predetermined level threshold,
generate the 5-level load signal when the audio signal level is smaller than the predetermined level threshold.

12. The class D audio amplifier according to claim 10, wherein the controller is further adapted to:
altering a switching or modulation frequency of each of the first, second, third and fourth, fifth, sixth, 7th and 8th pulse width modulated control signals depending on the detected level of the audio input signal.

13. The class D audio amplifier according to claim 7, wherein the upper leg of the first output driver comprises a 5th or 9th semiconductor switch coupled in series with the first semiconductor switch and the first DC supply voltage and the lower leg of the first output driver comprises a 6th or 10th semiconductor switch coupled in series with the fourth semiconductor switch and the second DC supply voltage; and
a second or third DC voltage source configured to set a second or third predetermined DC voltage difference between a third or 5th node, located between the 5th or 9th semiconductor switch and the first semiconductor switch, and a 4th or 6th node, located between the 6th or 10th semiconductor switch and the 4th semiconductor switch, and optionally:
wherein the upper leg of the second output driver comprises an 11th semiconductor switch coupled in series with the 5th semiconductor switch and the first DC supply voltage and the lower leg of the second output driver comprises a 12th semiconductor switch coupled in series with the 8th semiconductor switch and the second DC supply voltage; and
a fourth DC voltage source configured to set a fourth predetermined DC voltage difference between a 5th node, located between the 11th semiconductor switch and the 5th semiconductor switch, and 6th node, located between the 8th and 12th semiconductor switches.

14. The class D audio amplifier according to claim 13, wherein at least one of the first, second, third or fourth DC voltage sources comprises at least one component from a group of {a charged capacitor, a floating DC supply rail, a battery}.

15. The class D audio amplifier according to claim 13, wherein one or more of the first, second, third or fourth DC voltage sources comprises a charged capacitor; each capacitor having a capacitance between 100 nF and 10 μF.

16. The class D audio amplifier according to claim 13, wherein:
the first predetermined DC voltage difference is set to substantially one-half of a DC voltage difference between the first and second DC supply voltages, or
a third supply voltage of the third DC voltage source is set to set to substantially one-half of the voltage difference between the first and second supply voltages.

17. The class D audio amplifier according to claim 1, wherein the controller comprises a programmable Digital Signal Processor.

18. A sound reproducing assembly, comprising:
the class D audio amplifier according to claim 7; and
the loudspeaker load according to claim 7 operatively coupled to the output node of the first driver and one of the first and second DC supply voltages, or
the loudspeaker load according to claim 7 operatively coupled in-between the first and second output nodes of the first and second output drivers, respectively.

* * * * *